(12) United States Patent
Saito et al.

(10) Patent No.: US 8,909,021 B2
(45) Date of Patent: Dec. 9, 2014

(54) SEMICONDUCTOR OPTICAL DEVICE

(75) Inventors: Shinichi Saito, Kawasaki (JP); Masahiro Aoki, Kokubunji (JP); Toshiki Sugawara, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 124 days.

(21) Appl. No.: 13/521,605

(22) PCT Filed: Feb. 1, 2010

(86) PCT No.: PCT/JP2010/051332
§ 371 (c)(1),
(2), (4) Date: Jul. 11, 2012

(87) PCT Pub. No.: WO2011/092861
PCT Pub. Date: Aug. 4, 2011

(65) Prior Publication Data
US 2012/0288228 A1    Nov. 15, 2012

(51) Int. Cl.
| | | |
|---|---|---|
| *G02B 6/00* | (2006.01) | |
| *G02B 6/36* | (2006.01) | |
| *H01S 5/30* | (2006.01) | |
| *G02F 1/225* | (2006.01) | |
| *H01S 5/02* | (2006.01) | |
| *G02B 6/122* | (2006.01) | |
| *B82Y 20/00* | (2011.01) | |
| *G02B 6/12* | (2006.01) | |
| *G02F 1/21* | (2006.01) | |
| *H01S 5/042* | (2006.01) | |
| *H01S 5/32* | (2006.01) | |
| *H01S 5/12* | (2006.01) | |

(52) U.S. Cl.
CPC .............. *G02B 6/122* (2013.01); *H01S 5/3027* (2013.01); *G02F 1/2257* (2013.01); *H01S 5/021* (2013.01); *G02F 2202/06* (2013.01); *G02B 2006/12097* (2013.01); *G02F 2202/105* (2013.01); *G02F 2202/09* (2013.01); *G02F 2001/212* (2013.01); *H01S 5/0424* (2013.01); *H01S 5/3202* (2013.01); *B82Y 20/00* (2013.01); *G02F 2203/06* (2013.01); *G02B 2006/12178* (2013.01); *G02F 2201/12* (2013.01); *H01S 5/12* (2013.01); *G02F 1/218* (2013.01)
USPC .......................................................... 385/147

(58) Field of Classification Search
CPC ........................................................ G02B 6/00
USPC .......................................................... 385/147
See application file for complete search history.

(56) References Cited

U.S. PATENT DOCUMENTS

| | | | | |
|---|---|---|---|---|
| 6,316,281 | B1 * | 11/2001 | Lee et al. ................... | 438/31 |
| 6,944,369 | B2 * | 9/2005 | Deliwala .................... | 385/30 |
| 7,616,843 | B2 | 11/2009 | Ishizaka | |
| 2006/0281234 | A1 | 12/2006 | Sugiyama et al. | |

(Continued)

FOREIGN PATENT DOCUMENTS

| | | |
|---|---|---|
| JP | 2004-77305 A | 3/2004 |
| JP | 2004-85744 A | 3/2004 |

(Continued)

OTHER PUBLICATIONS

Kevin K. Lee "Fabrication of ultralow-loss $Si/SiO_2$ waveguides by roughness reduction", Optics Letters, vol. 26, No. 23, 2001, pp. 1888-1890.

(Continued)

*Primary Examiner* — Akm Enayet Ullah
(74) *Attorney, Agent, or Firm* — Miles & Stockbridge P.C.

(57) ABSTRACT

Disclosed is a silicon optical waveguide having a small optical loss and no polarization dependency. The silicon optical waveguide is formed on a silicon substrate with an embedded oxide film therebetween, the plane orientation of the surface of the silicon optical waveguide is the (110) plane, the plane orientation of the side wall is the (111) plane, and the recesses and projections of the side wall are planarized at an atomic level.

12 Claims, 42 Drawing Sheets

(56) References Cited

U.S. PATENT DOCUMENTS

2008/0128713 A1 6/2008 Saito et al.
2011/0158582 A1* 6/2011 Su et al. ........................... 385/14

FOREIGN PATENT DOCUMENTS

| JP | 2005-300678 A | 10/2005 |
| JP | 2006-351612 A | 12/2006 |
| JP | 2007-178550 A | 7/2007 |
| JP | 2007-294628 A | 11/2007 |

OTHER PUBLICATIONS

English translation of Office Action issued Dec. 25, 2012, in Japanese Patent Application No. 2011-551653.

* cited by examiner

SEMICONDUCTOR OPTICAL DEVICE

TECHNICAL FIELD

The present invention relates to an optical element using silicon.

BACKGROUND ART

In the modern society where throughput of the computer has improved exponentially and information runs about the world in an instant, the optical communications including also short distance communication are becoming important. Actually, researches and developments of optical interconnection for performing information communication of not more than several meters, such as between boards and within a board of a supercomputer, have become active. Furthermore, researches of optical wiring technologies for realizing even wiring between chips and in a chip with light have begun as ultimate technologies.

A research area in which the optical wiring of a short distance, such as between chips and in a chip of silicon, is intended to be realized with optical devices using silicon is termed silicon photonics, which is a technology of trying to fabricate the optical devices utilizing sophisticated silicon lines that have spread widely worldwide.

One of important optical components in realizing the silicon photonics is an optical waveguide. Although the optical waveguide is a passive optical component for transmitting light, silicon with a large refractive index can be used as its material.

The conventional optical waveguides using silicon had optical losses of about 0.22 to 2.0 dB/cm. Although values of these optical losses are small as those of optical waveguides using silicon, they are five to six orders of magnitude larger than a loss of optical fiber. Although in the optical wiring in a silicon chip, transmission distances are overpoweringly small compared with global long-distance optical communications, such large optical losses cannot be disregarded. Especially, in a global wiring use in the silicon chip and other uses, it is necessary to cover a distance of 10 mm or more despite within the silicon chip, and reduction of the loss is desired. Moreover, since in the case of forming an optical circuit and modulating an optical signal, further long optical waveguide is required, and therefore, it becomes important to reduce the loss.

In order to produce such an optical waveguide using silicon, a method for processing a silicon core by dry etching and a method for processing a silicon core by wet etching described in nonpatent literature 1 are considerable.

CITATION LIST

Patent Literatures

Patent Literature 1: Japanese Unexamined Patent Application Publication No. 2007-294628
Patent Literature 2: Japanese Unexamined Patent Application Publication No. 2006-351612

Nonpatent Literatures

Nonpatent Literature 1: K. K. Lee, D. R. Lim, L. C. Kimerling, J. Shin, and F. Cerrina, Optics Lett., Vol. 26, pp. 1888-1890, 2001

SUMMARY OF INVENTION

Technical Problem

A cause of a propagation loss described above is line edge roughness that arises in forming a silicon optical waveguide.

When processing a silicon core by dry etching, the dry etching is performed on a silicon film on an SOI. Even if it uses an etching technology of currently highest performance, the technology has not reached to a standard in which the silicon is processed to be completely vertical to a forming face and silicon sidewalls are free from unevenness at an atomic level. This partly originates from a fact that a plane orientation of resist molecules used for lithography is random, and it cannot be avoided that a variation of a few nm equal to a size of one or several molecules or so.

On the other hand, the method for processing silicon by anisotropic wet etching using an alkaline solution disclosed in Nonpatent Literature 1 is one that uses a phenomenon that an etching rate of single crystal silicon in an alkaline solution varies with a plane orientation, and especially when a silicon surface becomes a (111) plane, virtually no etching in the alkaline solution progresses. As a result, an interface can be flatly processed at an atomic level. Incidentally, when describing as the (111) plane in this specification, a (11-1) plane, a (-1-1-1) plane, etc. that are crystallographically equivalent directions may be described as the (111) plane without necessarily differentiating them. Similarly, it goes without saying that a (100) plane is equivalent to a (001) plane.

However, in the case where the wet etching is performed with the above-mentioned alkaline solution using an SOI substrate that has the (100) plane used in the usual CMOS process as an outermost surface, it is processed to have a trapezoidal shape as a sectional shape as shown in Nonpatent Literature 1. If the substrate is processed to be in such a form, a refractive index profile will change in a horizontal direction and in a vertical direction to the substrate, and therefore effective refractive index will change depending on TE polarization and TM polarization of a polarization mode of light passing though the optical waveguide. This polarization dependency causes a problem that a propagation velocity of light will change. This problem is fatal, especially, in the case of connecting with optical fiber and will produce a need to fabricate an optical passive circuit so that polarization dependency of incident light may be eliminated, which gives a problem of making a design complicated and increasing a cost.

That is, with the conventionally known optical waveguide structure using silicon, it was impossible to realize the optical waveguide having the silicon optical waveguide sidewalls that was flat enough to reduce its optical loss at an atomic level and moreover to reduce the polarization dependency.

An object of the present invention is to provide an optical element having a low-loss silicon optical waveguide whose polarization dependency is improved.

Solution to Problem

This application includes multiple means suited to solve the above-mentioned problems. Illustrating its typical means, it will be what is disclosed in the scope of claims.

Advantageous Effects of Invention

According to the present invention, the optical element having the low-loss optical waveguide whose polarization dependency is improved can be provided.

DESCRIPTION OF EMBODIMENTS

Hereinafter, embodiments according to the present invention will be described in detail based on drawings. Incidentally, in all diagrams for explaining the embodiments, the same symbols are given to members having the same functions, and their repeated explanations are omitted. Moreover, it goes without saying that many modifications, such as changes in materials and combinations of manufacturing processes, are possible besides a method to be introduced in these embodiments.

Hereafter, the specific embodiments will be described. Drawings described in the diagrams are not necessarily drawn to scale correctly, rather the drawings are schematically drawn emphasizing important portions so that logic may become clear.

First Embodiment

In this embodiment, a silicon optical waveguide whose optical loss is reduced and polarization dependency is improved and its production method will be disclosed.

FIG. 1 to FIG. 6 show sectional strictures in a sequence of the manufacturing processes and schematic diagrams of a substrate as seen from its upper part in the sequence of the manufacturing processes. A completion drawing of the silicon optical waveguide in this embodiment is FIG. 6.

Hereinafter, the manufacturing processes will be explained step by step.

Figure 1:
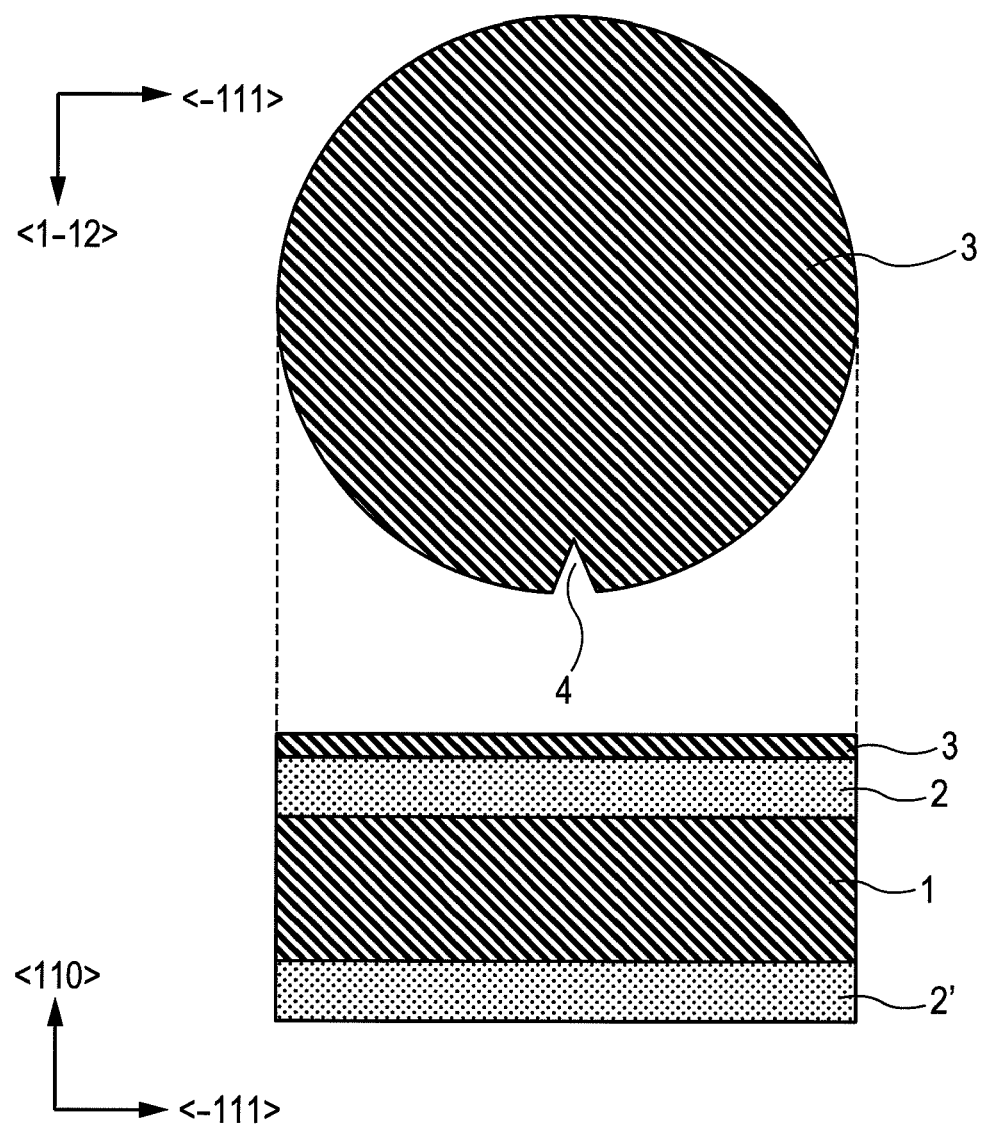
FIG. 1 is a diagram showing a sequence of a manufacturing process of a silicon optical waveguide according to a first embodiment.

First, as shown in FIG. 1, an SOI (Silicon On Insulator) substrate in which a silicon substrate 1 as a supporting substrate, a silicon dioxide film 2 (hereinafter, it may be called a BOX (Buried Oxide) layer) as an embedding insulator film; and a single crystal silicon film 3 (hereinafter, it may be called an SOI (Silicon On Insulator) layer) as a semiconductor film are layered in this order is prepared. Here, a plane orientation of the surface of the single crystal silicon film 3 was set to a (110) plane. Moreover, as shown in FIG. 1, a cut called a notch 4 is made on an SOI substrate at a position on a wafer end face lying in a direction in which the crystalline direction becomes <1-12> seen from a center of the SOI substrate. Although this is for fixing the sidewall plane orientation of the silicon optical waveguide, and it is all right that an SOI substrate such that an other direction, for example, a direction perpendicular to the notch, is set to <1-12> is prepared. In that case, what is different is that only a principal propagation direction of light in the silicon optical waveguide takes a direction perpendicular to the notch. Naturally, although an arbitrary angle is also possible, since in a usual CMOS design, patterns of lithography are often rectangular patterns that are horizontal or perpendicular to the notch, it is desirable not to dare to take an oblique direction as a principal axis. An initial thickness of the silicon film 3 trial-manufactured in this embodiment before the process was 310 nm. Moreover, a film thickness of the silicon dioxide film 2 was 2000 nm. By thickening the thickness of the BOX layer 2, the light spreads into a material whose refractive index is large, the SOI substrate having the silicon dioxide film 2 thus thick is used in this embodiment so that the light may not diffuse into the silicon substrate 1. In order to reduce the optical loss of the silicon optical waveguide, it is desirable that the film thickness of the BOX layer (the silicon dioxide film 2) is more than or equal to 1 μm at the minimum.

As is clear from FIG. 1, a silicon dioxide film 2' is also formed on a reverse side of the silicon substrate 1. This is for preventing a warp of the silicon substrate 1 (wafer). Since the silicon dioxide film 2 as thick as 2000 nm is formed, a strong compressive stress is applied to the silicon substrate 1, it is devised so that the wafer may not warp as a whole by forming the silicon films on the surface and the back surface (a principal plane and a back plane opposite to the principal plane) to the same thickness. Attention should be paid so that the silicon dioxide film 2' of this reverse side also may not get lost during the process. This is because there is a fear that if the silicon dioxide film 2' on the back side disappears during processes of cleaning and wet etching, the wafer will be warped and become impossible to be sucked by an electrostatic chuck, which will prevent the manufacturing processes after that from being performed.

Figure 2:
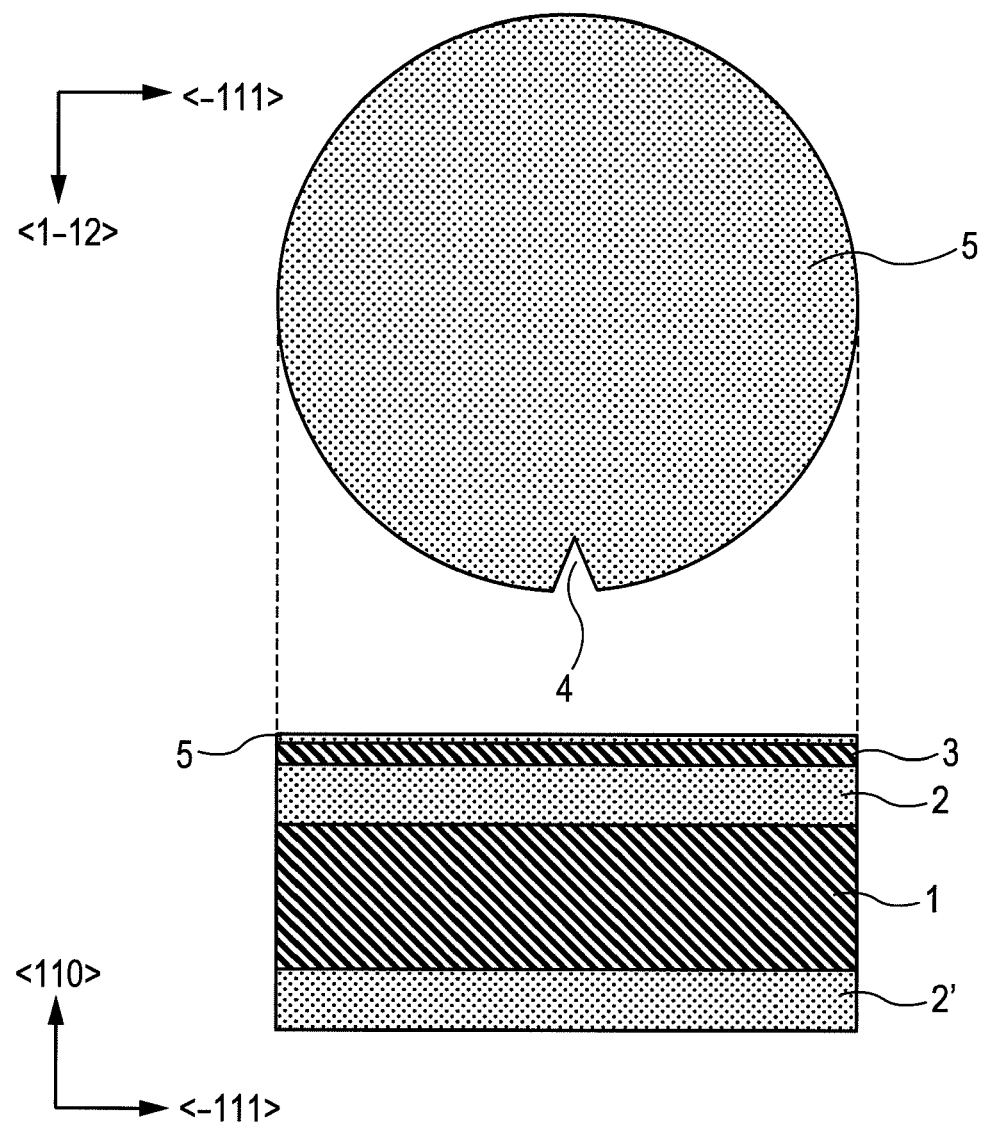
FIG. 2 is a diagram showing a sequence of a manufacturing process of the silicon optical waveguide according to the first embodiment.

Next, after cleaning the prepared SOI substrate, it is made in a state where a silicon dioxide film 5 as thick as 20 nm is grown by oxidizing the surface, shown in FIG. 2.

Figure 3:
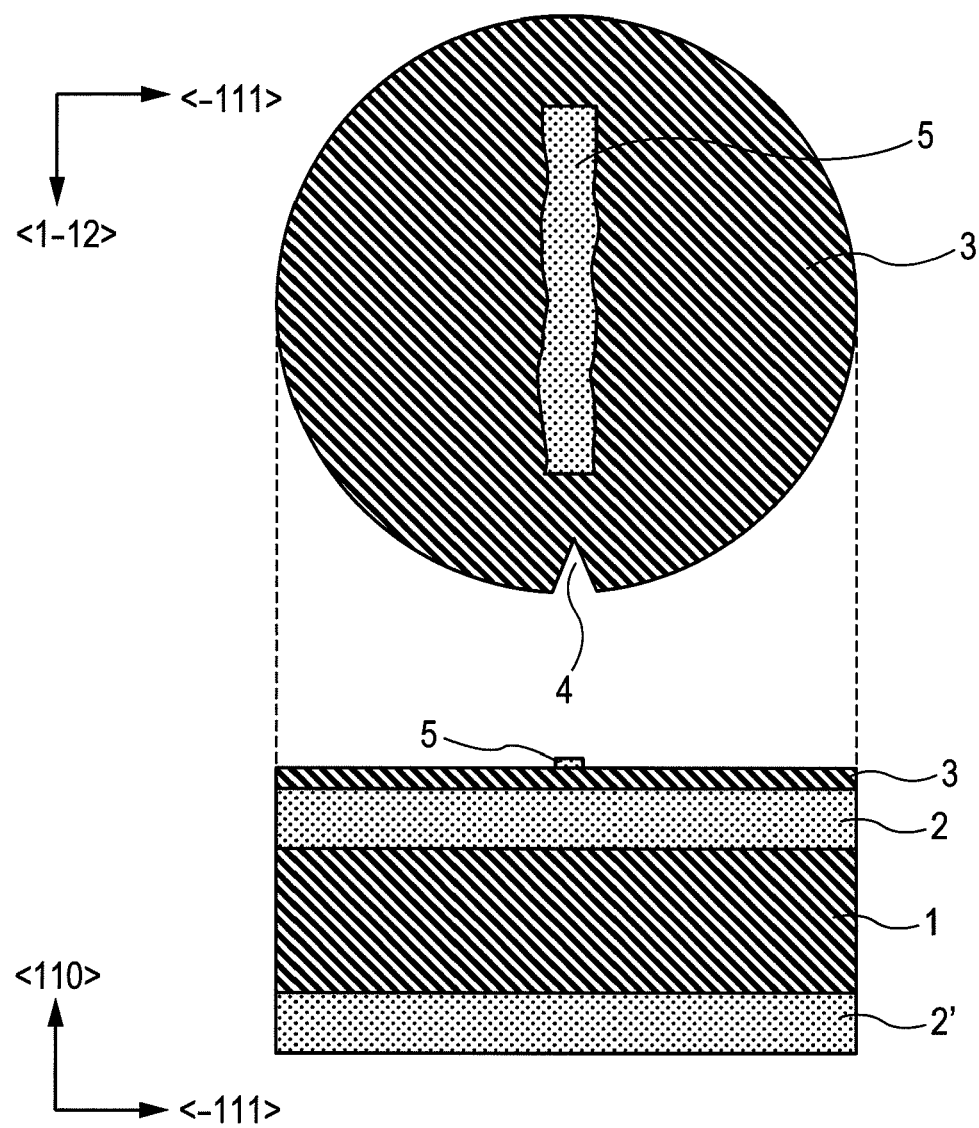
FIG. 3 is a diagram showing a sequence of a manufacturing process of the silicon optical waveguide according to the first embodiment.

Next, the silicon dioxide film 5 is processed to a desired shape using resist patterning using photolithography and dry etching to form a hard mask, subsequently, the resist is removed by an ashen, and the SOI substrate is made in a state shown in FIG. 3. As shown in FIG. 3, a design has been made in advance so that the principal direction in which the light is transmitted in the silicon optical waveguide being finally formed may be a <1-12> direction of the SOI layer. Moreover, a line width of the silicon dioxide film 5 as seen from the upper part shown in FIG. 3 was designed so as to be 300 nm. In FIG. 3, the optical waveguide is drawn emphasizing unevenness of the end in order to show importance of line edge roughness, but the actual size of the roughness was about a few nm.

Figure 4:
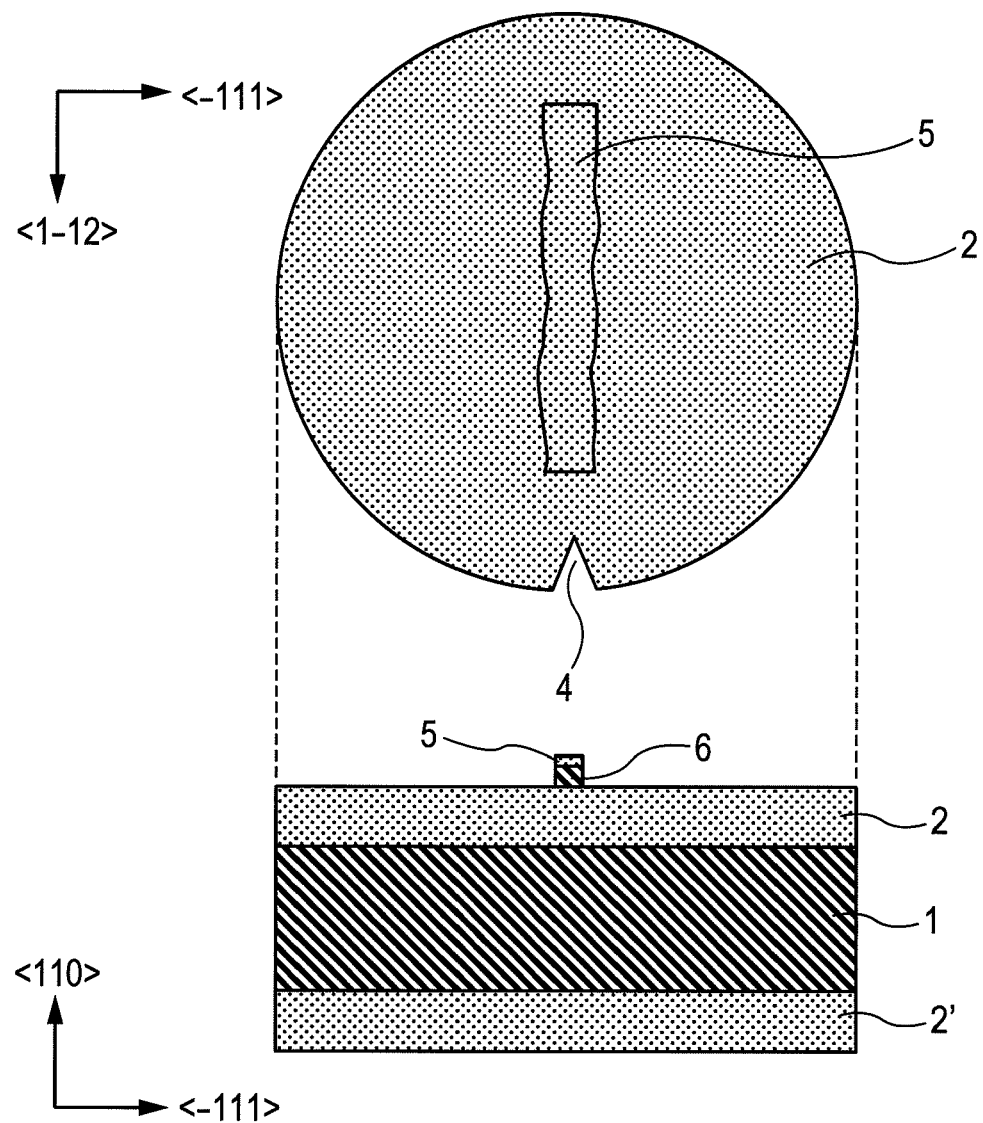
FIG. 4 is a diagram showing a sequence of a manufacturing process of the silicon optical waveguide according to the first embodiment.

Following this, after undergoing a cleaning process, anisotropic wet etching using an alkaline solution prepared by diluting TMAH (tetramethylammonium hydroxide) is performed, the SOI substrate was made in a state where a (111) plane was exposed on sidewall parts of the silicon optical waveguide, shown in FIG. 4. As a result of adjusting design dimensions and the film thickness, the sectional shape of a silicon optical waveguide core 6 becomes a rectangular shape (a square with a side of 300 nm). In addition, depending on how to adjust the design dimensions, it may be a rectangle. Moreover, it was also checked that the sidewall parts of the silicon optical waveguide are flat at an atomic level.

Figure 5:
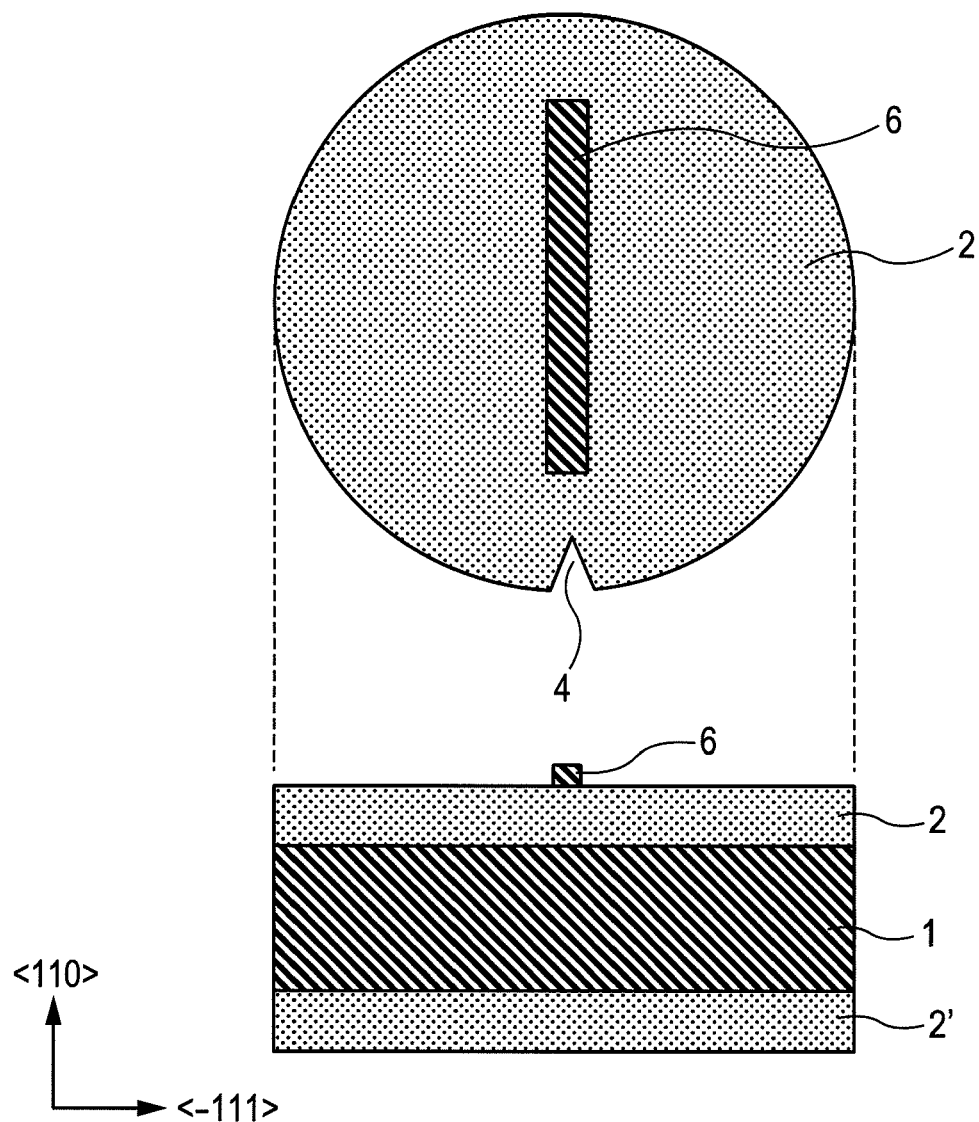
FIG. 5 is a diagram showing a sequence of a manufacturing process of the silicon optical waveguide according to a first embodiment.

Following this, the SOI substrate was made in a state where the silicon dioxide film 5 used as the hard mask was removed by wet etching in a solution containing hydrofluoric acid, shown in FIG. 5. Thereby, the line edge roughness that arose in the dry etching was able to be eliminated completely.

Figure 6:
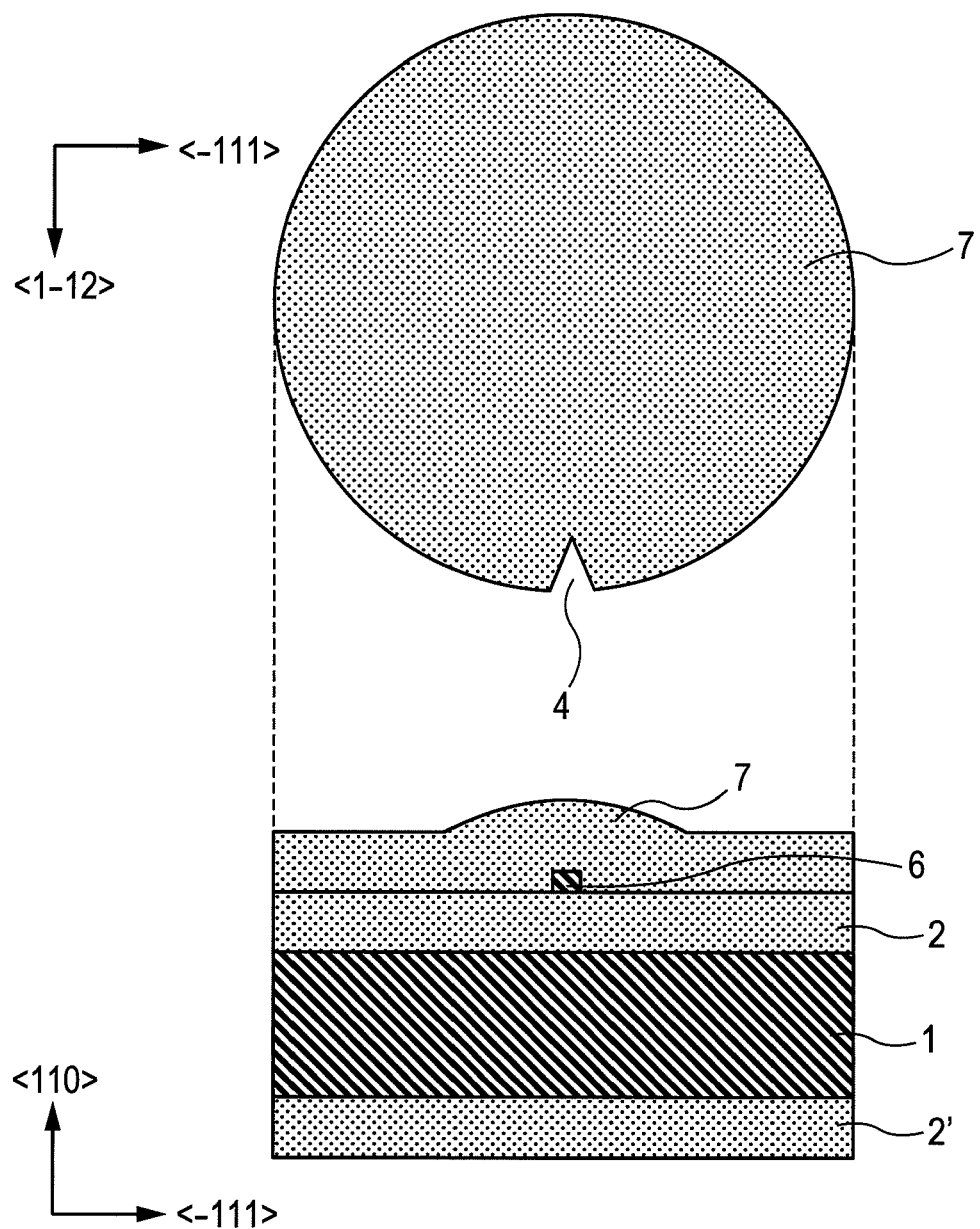
FIG. 6 is a completion drawing of the silicon optical waveguide according to the first embodiment.

Following this, after undergoing a cleaning process, a silicon optical waveguide was competed as shown in FIG. 6 by forming a silicon optical waveguide cladding 7 by depositing silicon dioxide to 1000 nm using a CVD system.

When the optical loss of the produced silicon optical waveguide was measured, it was checked to be 0.05 dB/cm or less. Moreover, it was also checked from the respective effective indices of the TE mode and the TM mode that the polarization dependency has been improved.

Second Embodiment

The first embodiment disclosed the silicon optical waveguide of low loss and improved polarization dependency. However, an optical circuit cannot be formed only with the high-performance optical waveguides, which is very natural. Especially, an optical modulator capable of modulating light at high speed is an important optical component.

Then, next, an optical modulator using the low-loss and polarization independent optical waveguide of the first embodiment will be explained. Since the Mach-Zehnder optical modulator shown in this embodiment uses the low-loss and polarization independent optical waveguide, it is possible to improve a modulation efficiency.

Figure 14:
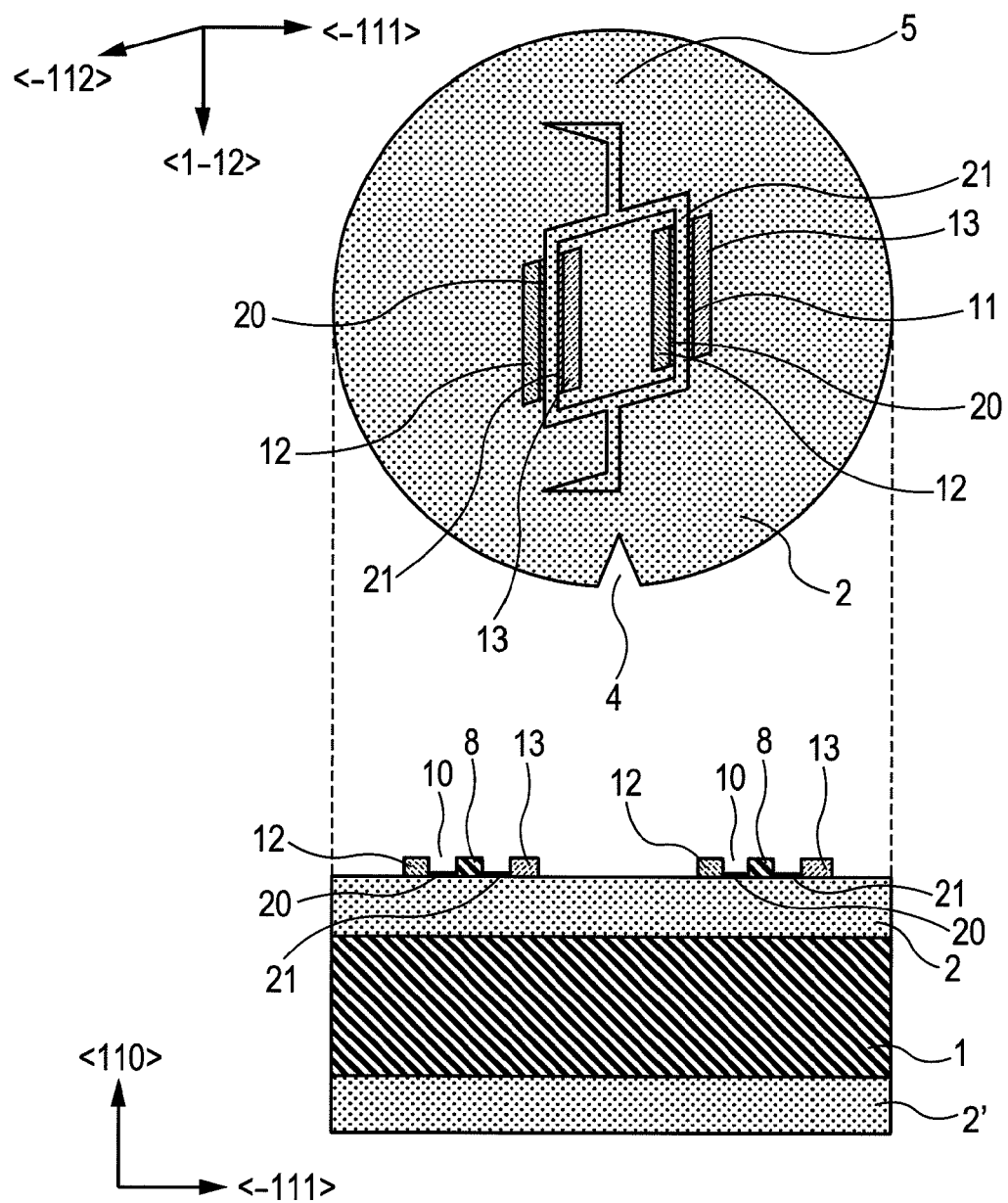
FIG. 14 is a diagram showing a sequence of a manufacturing process of the silicon modulator according to the second embodiment.
Figure 15:
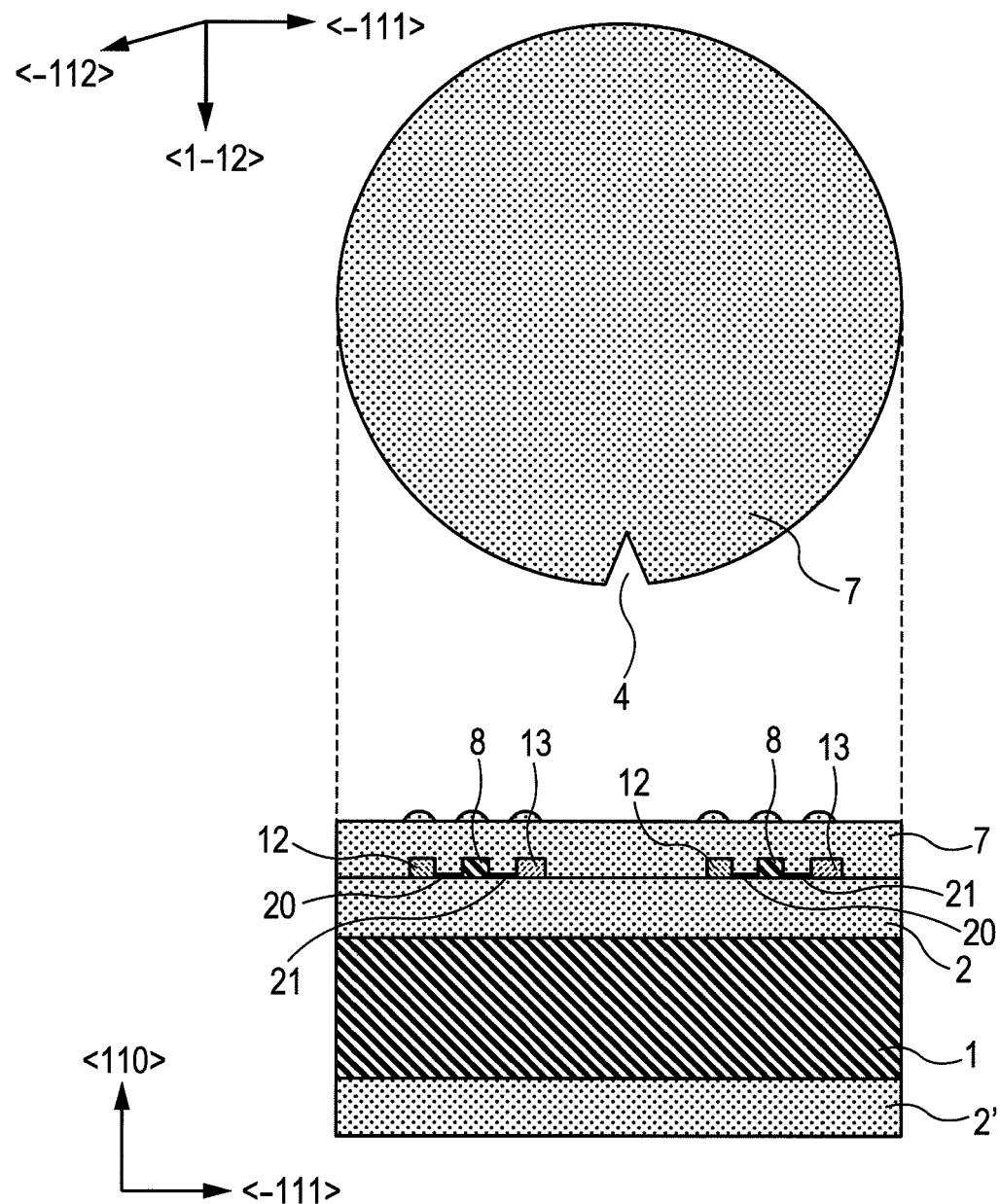
FIG. 15 is a diagram showing a sequence of a manufacturing process of the silicon modulator according to the second embodiment.
Figure 16:
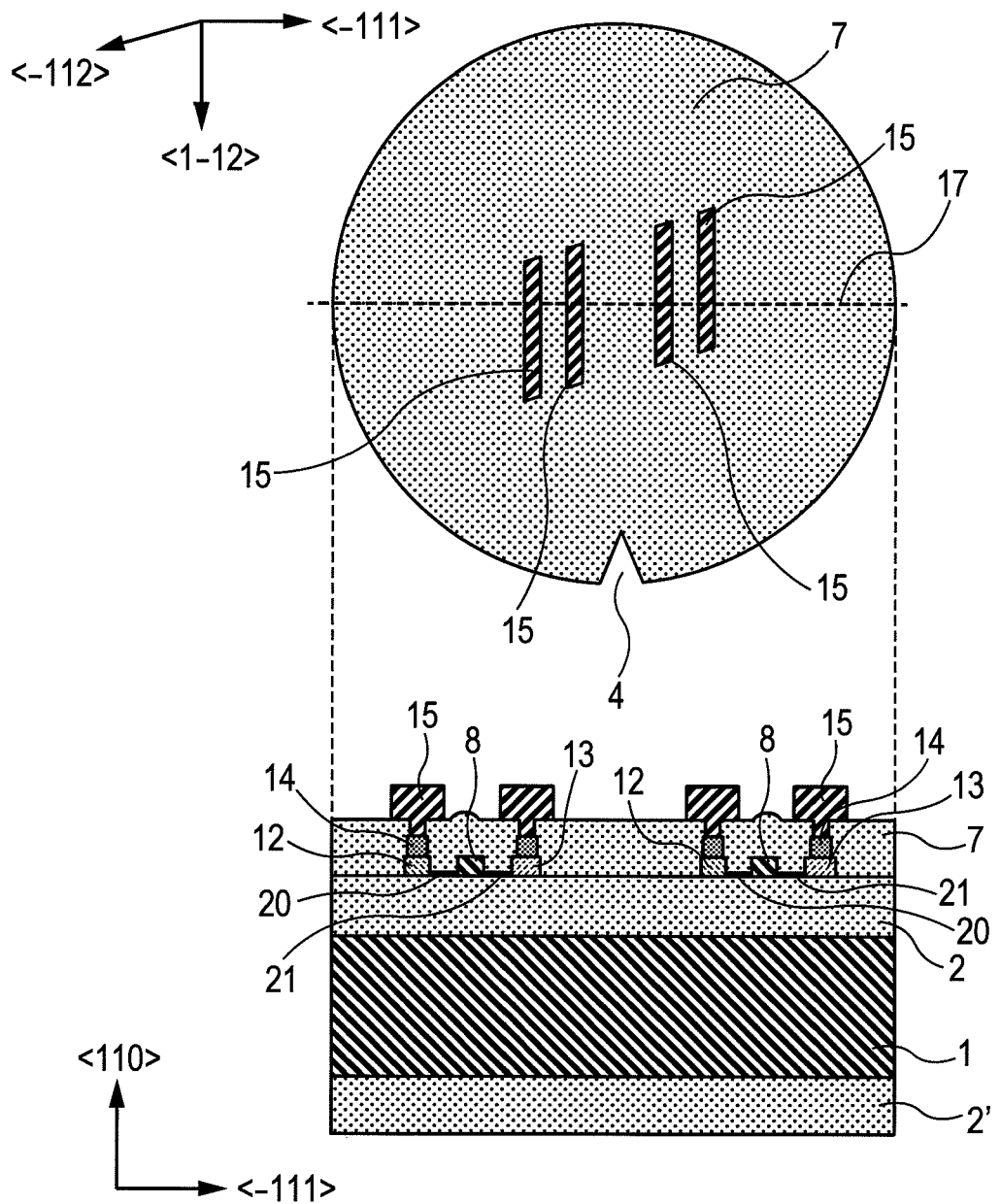
FIG. 16 is a completion sectional view of the silicon modulator according to the second embodiment.

FIG. 7 to FIG. 16 show sectional structures in a sequence of manufacturing processes and schematic diagrams of the substrate as seen from its upper part in the sequence of the manufacturing processes. The completion drawing of the silicon optical waveguide in this embodiment is FIG. 16. The sectional views cut along by a cutting line 17 in FIG. 16 are described in respective diagrams.

Below, the manufacturing processes will be explained step by step.

In this embodiment, the silicon waveguide is branched to two waveguides and light is made to propagate also in a <−112> direction. An angle that the <1-12> direction and the <−112> direction make is arc $\cos(\frac{1}{3}) \times 180/\pi \approx 70.5°$. In the case of adapting the <1-12> direction for a notch direction, what is necessary is just to make a design in the case of adapting the <−112> direction inverted flip horizontally to the notch as a center. An initial thickness of the silicon film 3 trial-manufactured in this embodiment before the process was 320 nm. Moreover, the film thickness of the silicon dioxide film 2 was 2000 nm.

Figure 7:
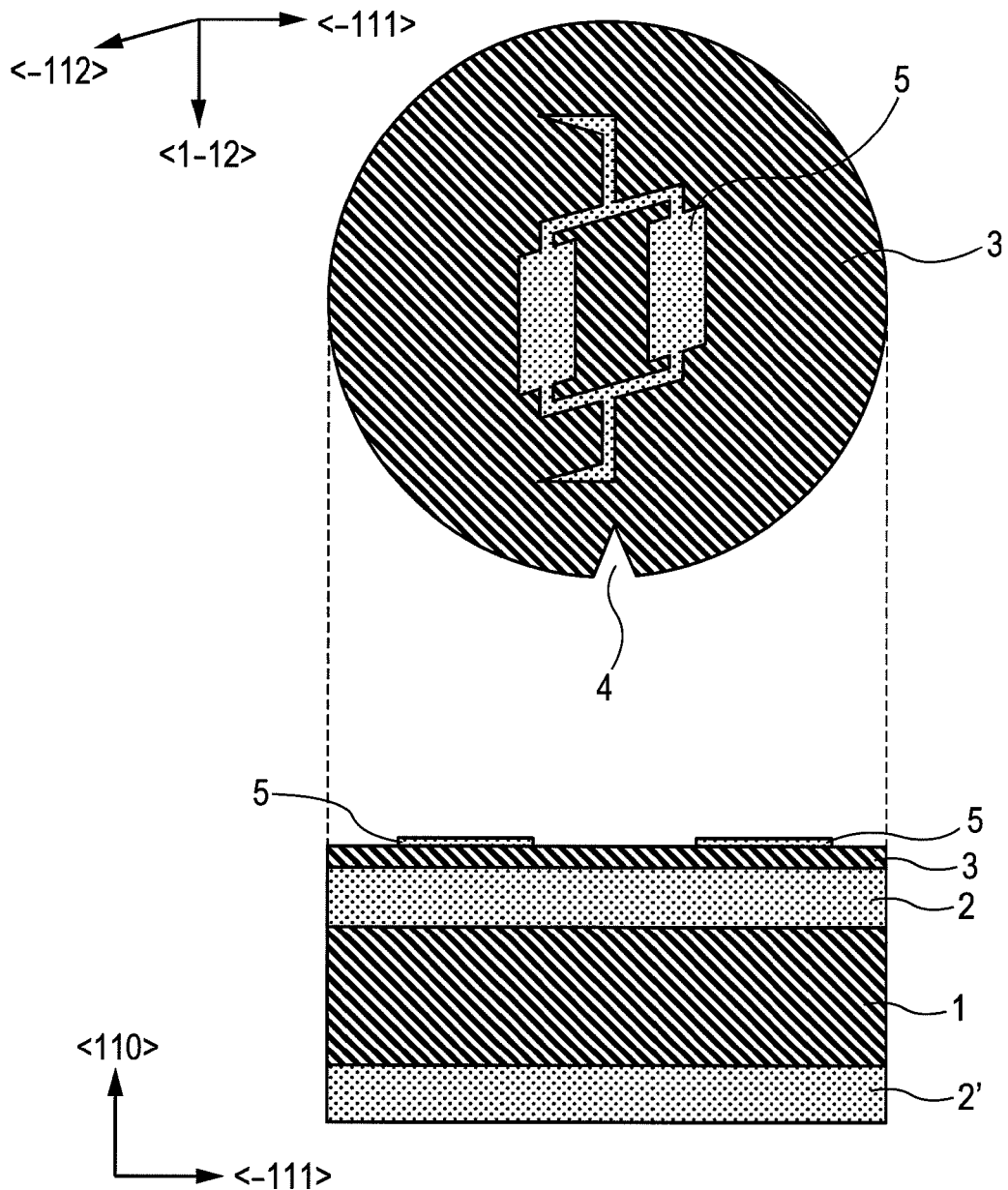
FIG. 7 is a diagram showing a sequence of a manufacturing process of a silicon modulator according to a second embodiment.

Since procedures before FIG. 7 are the same as procedures up to FIG. 2 of the first embodiment, their explanations are omitted.

Next, after the silicon dioxide film 5 is processed to the desired shape to form a hard mask using the resist patterning using photolithography and the dry etching, the SOI substrate is made in a state where the resist is removed by the asher, shown in FIG. 7. As shown in FIG. 7, the silicon optical waveguide to be finally formed is designed in advance so that principal directions in which the light propagates may lie in the <1-12> direction and the <−112> direction of the SOI layer. Moreover, the silicon dioxide film 5 was designed so that the line width thereof as seen from the upper part shown in FIG. 7 may become 310 nm. Although the SOI substrate was drawn without emphasizing unevenness of the line edge roughness described in first embodiment, it goes without saying that roughness of about a few nm arises on the side faces of the hard mask.

Figure 8:
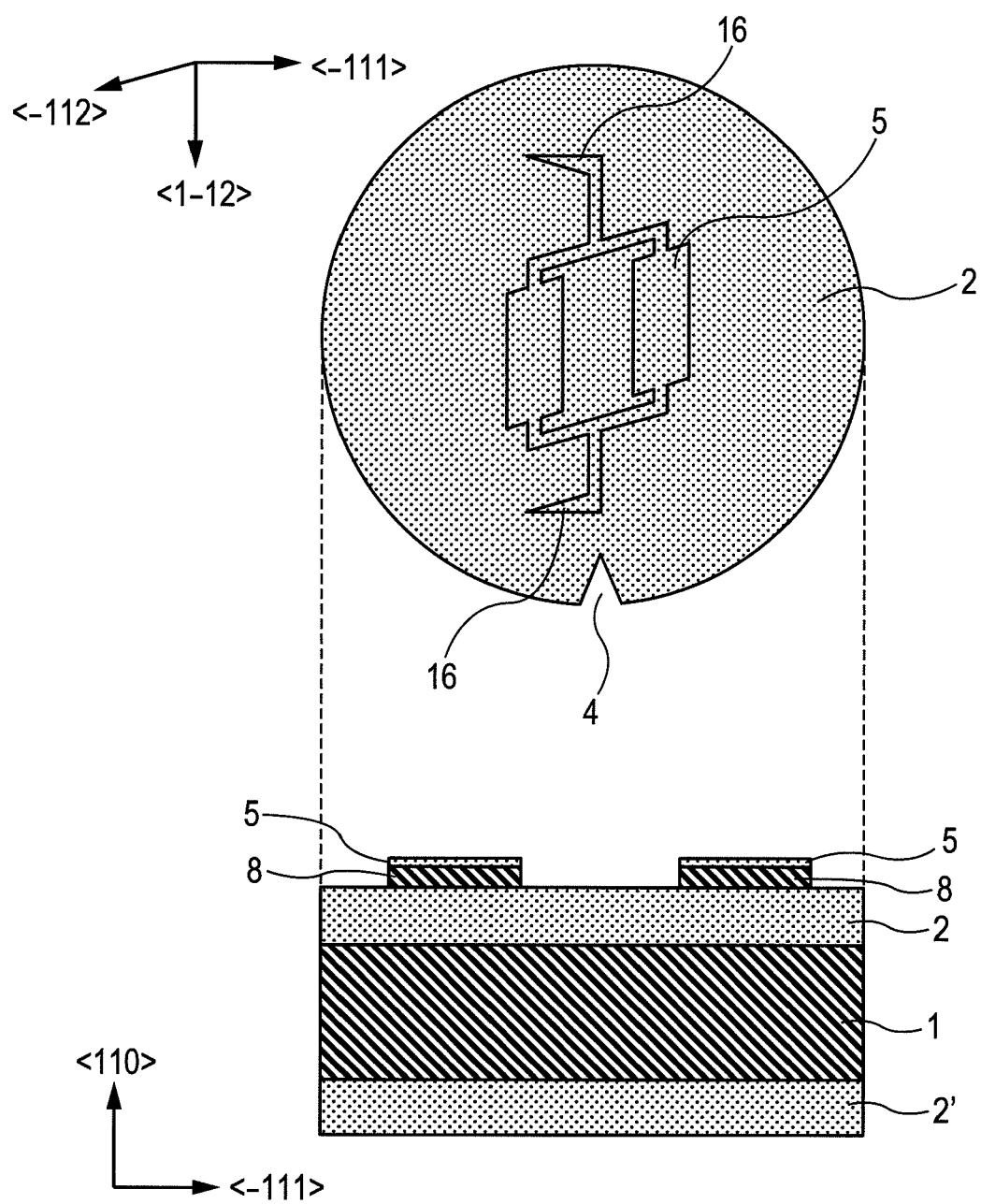
FIG. 8 is a diagram showing a sequence of a manufacturing process of the silicon modulator according to the second embodiment.
Figure 17:
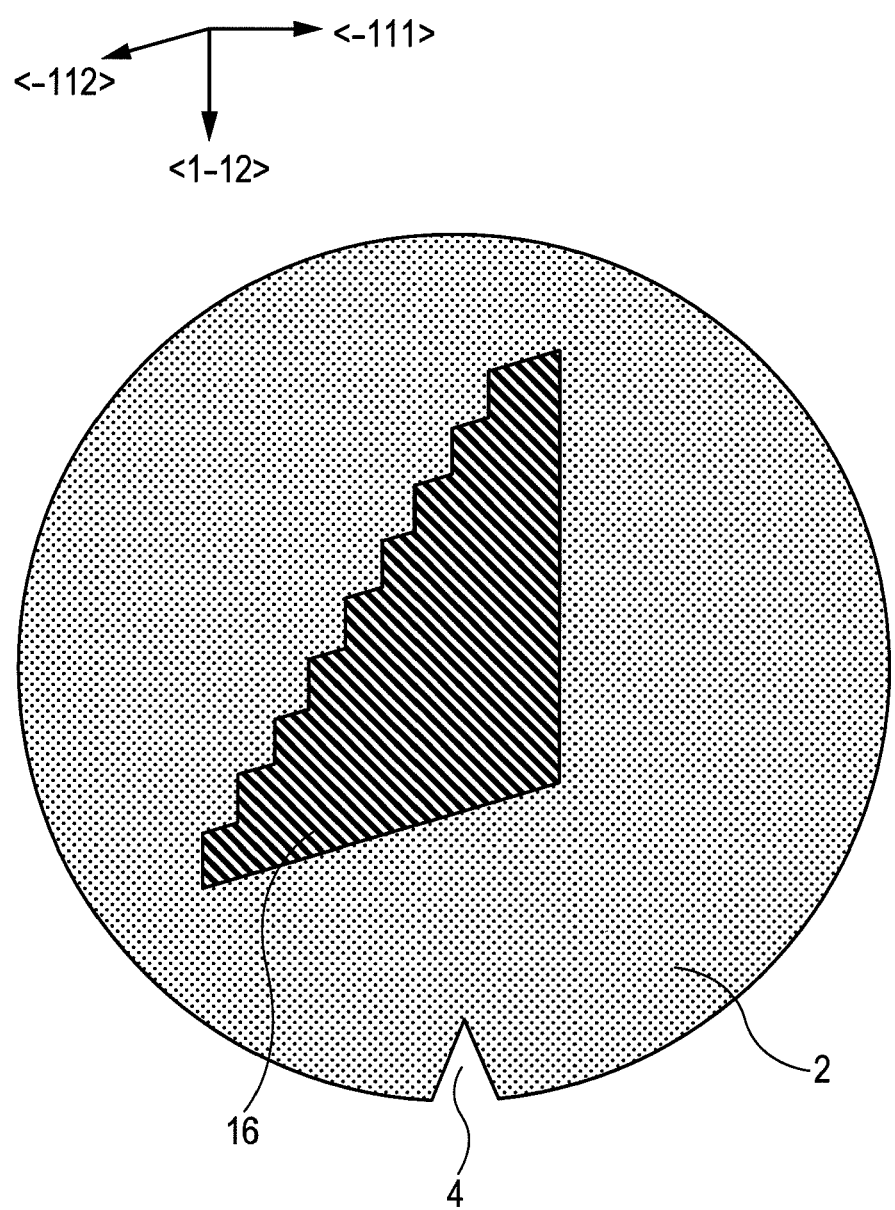
FIG. 17 is a diagram of a tapered optical coupler according to the second embodiment as seen from its upper part.
Figure 18:
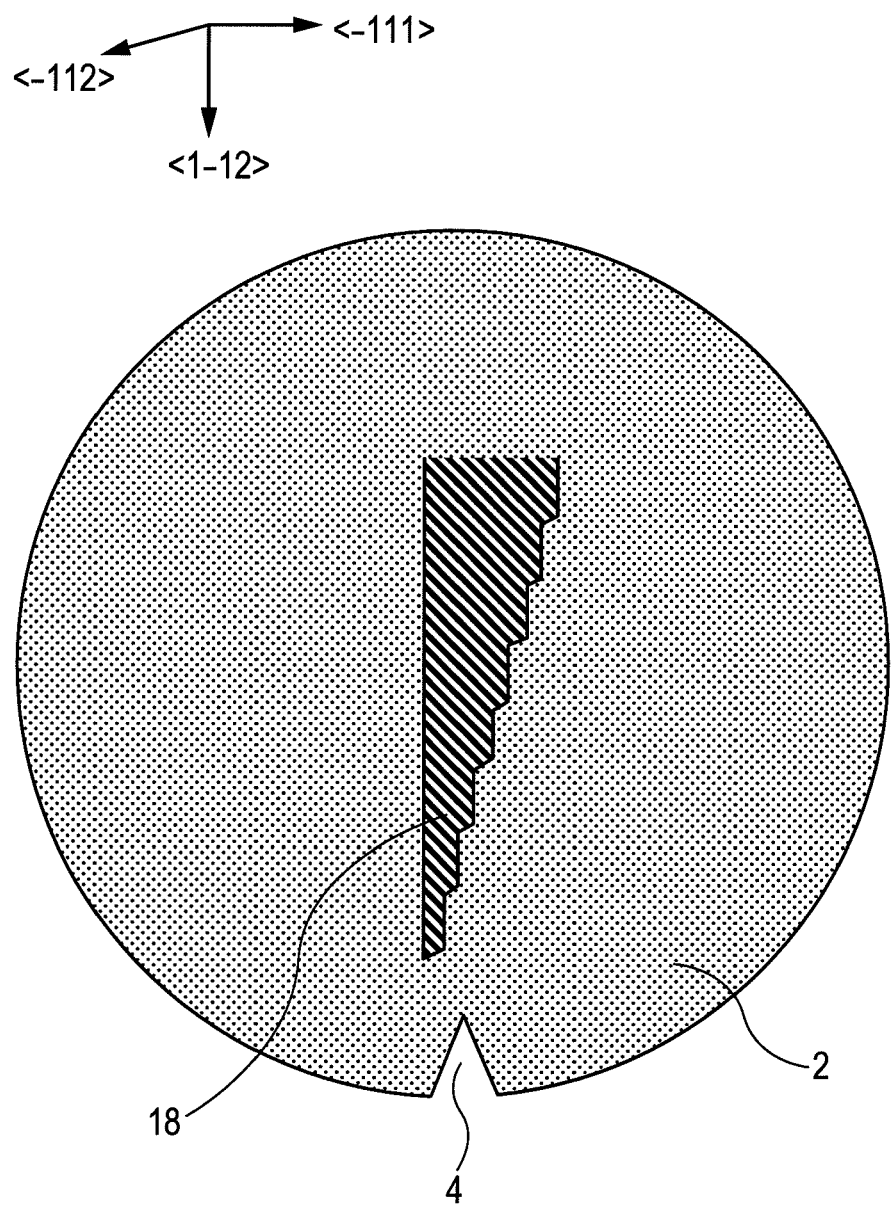
FIG. 18 is a diagram of an inverse tapered optical coupler according to the second embodiment as seen from its upper part.
Figure 19:
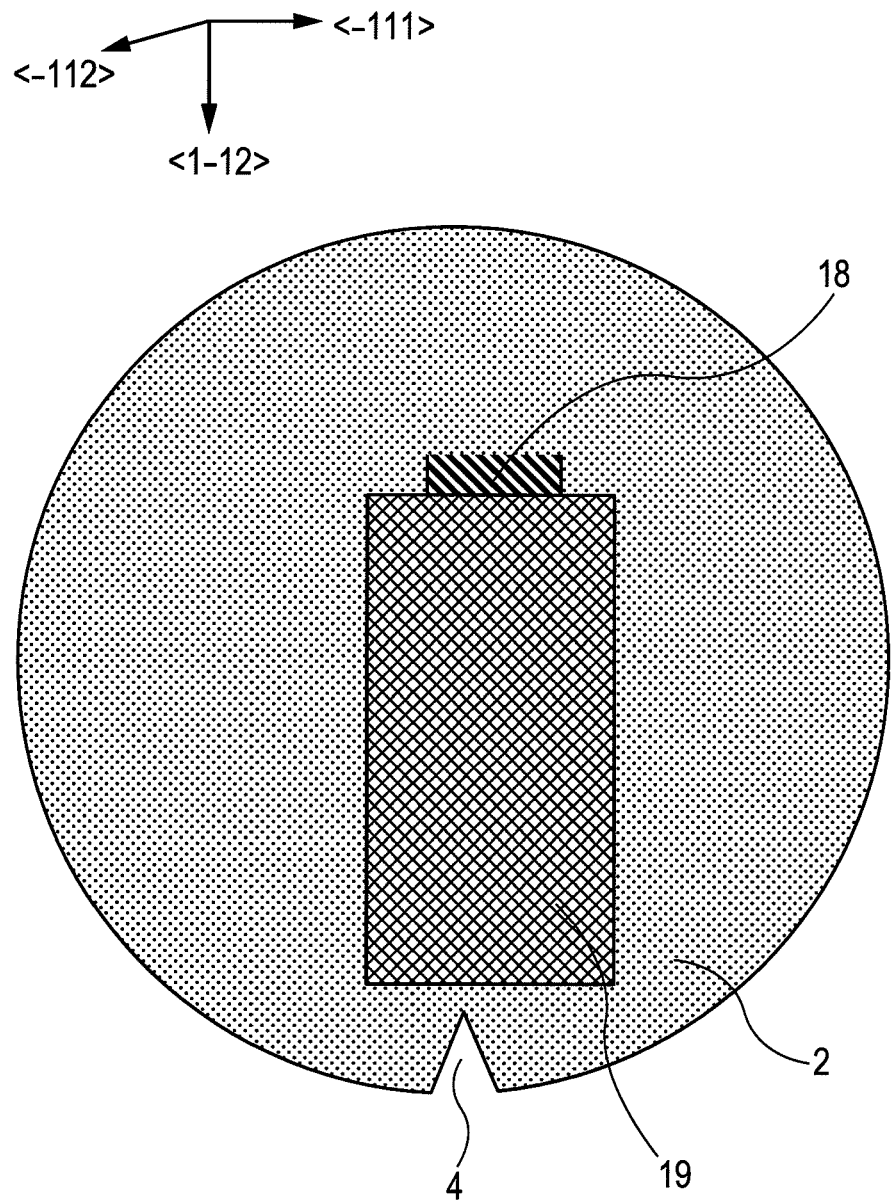
FIG. 19 is a diagram of a connection part according to the second embodiment as seen from its upper part.
Figure 20:
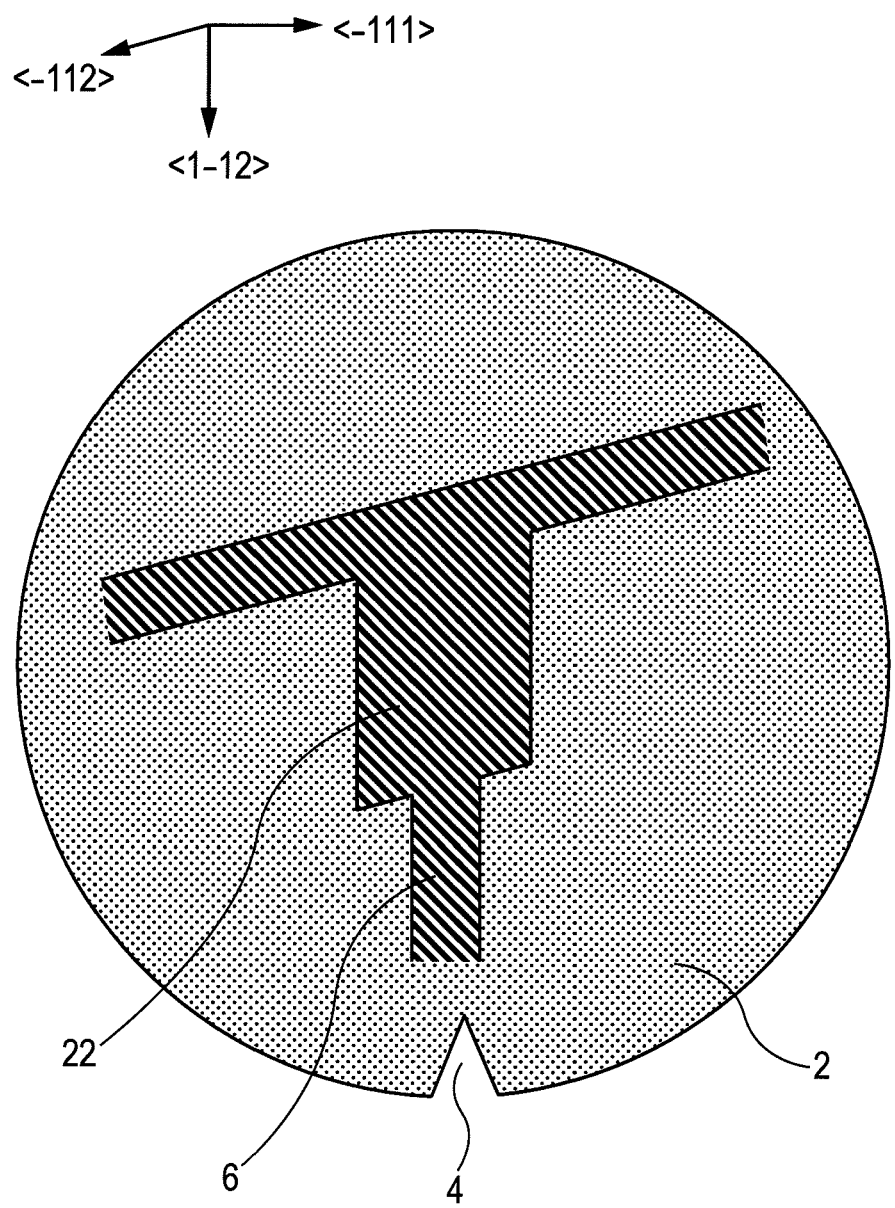
FIG. 20 is a diagram of a T-character branch part according to the second embodiment as seen from its upper part.
Figure 21:
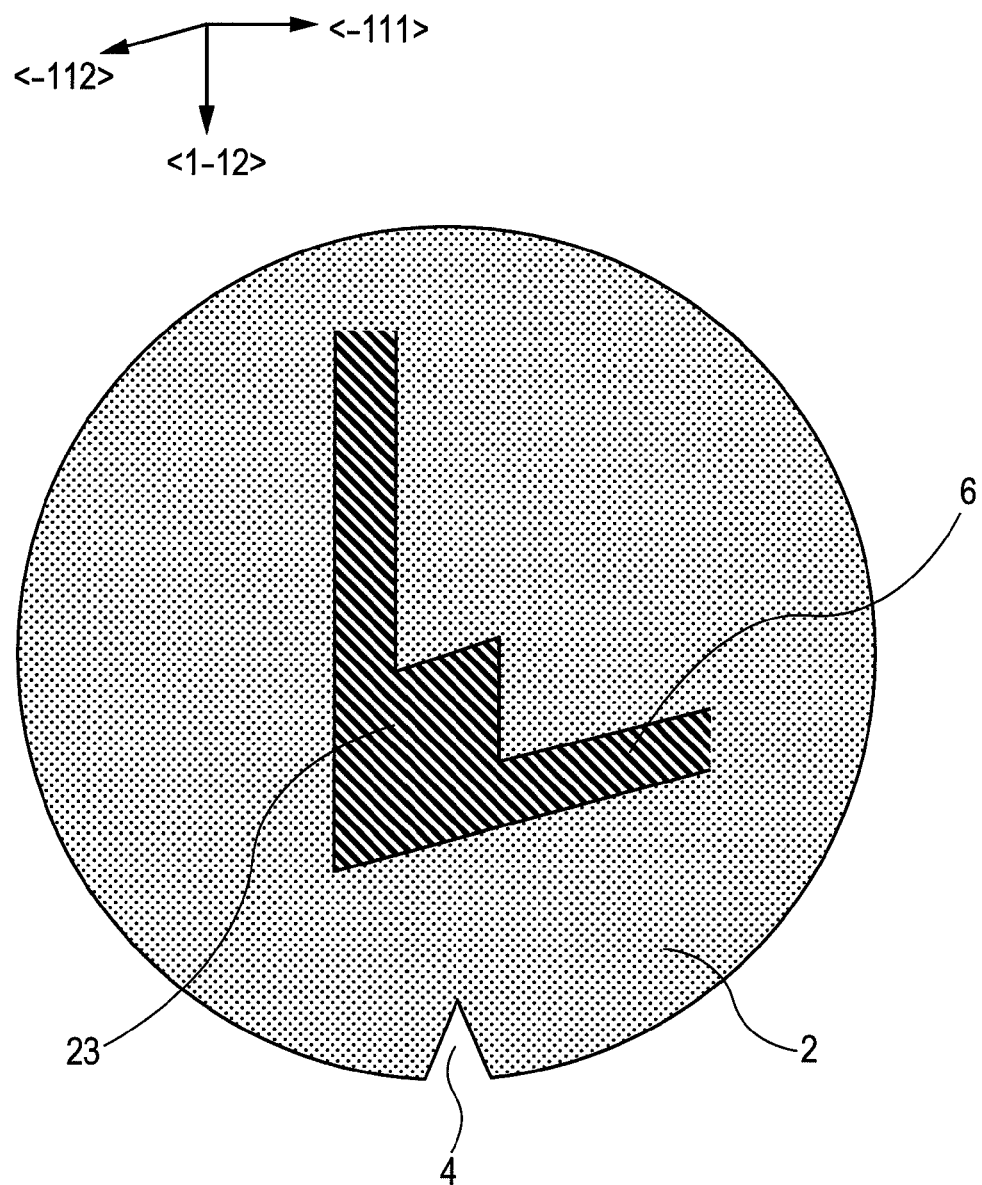
FIG. 21 is a diagram of a steep bend section according to the second embodiment as seen from its upper part.

Following this, the wet etching was performed like the first embodiment, and the SOI substrate was made in a state where the (111) plane was exposed on the sidewall parts of the silicon optical waveguide, shown in FIG. 8. As a result of adjusting the design dimensions and the film thickness, a sectional form of the silicon optical waveguide core 6 became a square shape of a side of 310 nm. Moreover, it was also checked that the sidewall parts of the silicon optical waveguide was flat at an atomic level. A modulation part silicon optical waveguide core 8 and a tapered optical coupling part 16 for input/output between the outside and the silicon optical waveguide are also drawn in FIG. 8. FIG. 17 shows what is looked like when enlarging the tapered optical coupling part 16. Here, disclosed is a capability of widening the optical waveguide in an arbitrary angle direction by combining the <1-12> direction and the <−112> direction and modifying the width of the optical waveguide stepwise little by little to effect widening of the width. Since widening the optical waveguide gradually by changing the width stepwise in this way makes it possible for light in the optical waveguide to be widening with adiabatic continuity, it becomes possible to reduce a loss when optical coupling is performed. Moreover, as an alternative system of optical coupling different from this, it is all right to adopt an inverse tapered optical coupling part 18 as shown in FIG. 18. In this case, what is necessary is just to narrow the silicon optical waveguide gradually by combining the <1-12> direction and the <−112> direction ingeniously. This inverse tapered optical coupling part 18 is connectable with an optical waveguide whose refractive index is lower than that of the silicon optical waveguide, for example, an inorganic optical waveguide that is formed of silicon dioxide, silicon nitride, etc., an organic optical waveguide 19, and the like, as shown in FIG. 19. Especially, if connection with the organic optical waveguide 19 is achieved, the silicon optical waveguide can easily be connected with an optical waveguide on a board larger than the silicon chip or the like. Moreover, enlarging a T-character branch part of the silicon optical waveguide core 6, it is designed so that the width of the silicon optical waveguide core 6 of a forked branch part 22 may become fat, as shown in FIG. 20. The propagation loss in the branch part can be reduced by making it fat in advance in this way. In addition, enlarging a portion where the silicon optical waveguide core 6 is bent steeply, it is designed so that a steep bend section 23 may become fat as shown in FIG. 21. By using the (111) plane as the sidewalls and contriving a layout like this, it became possible to reduce a bend loss.

Figure 9:
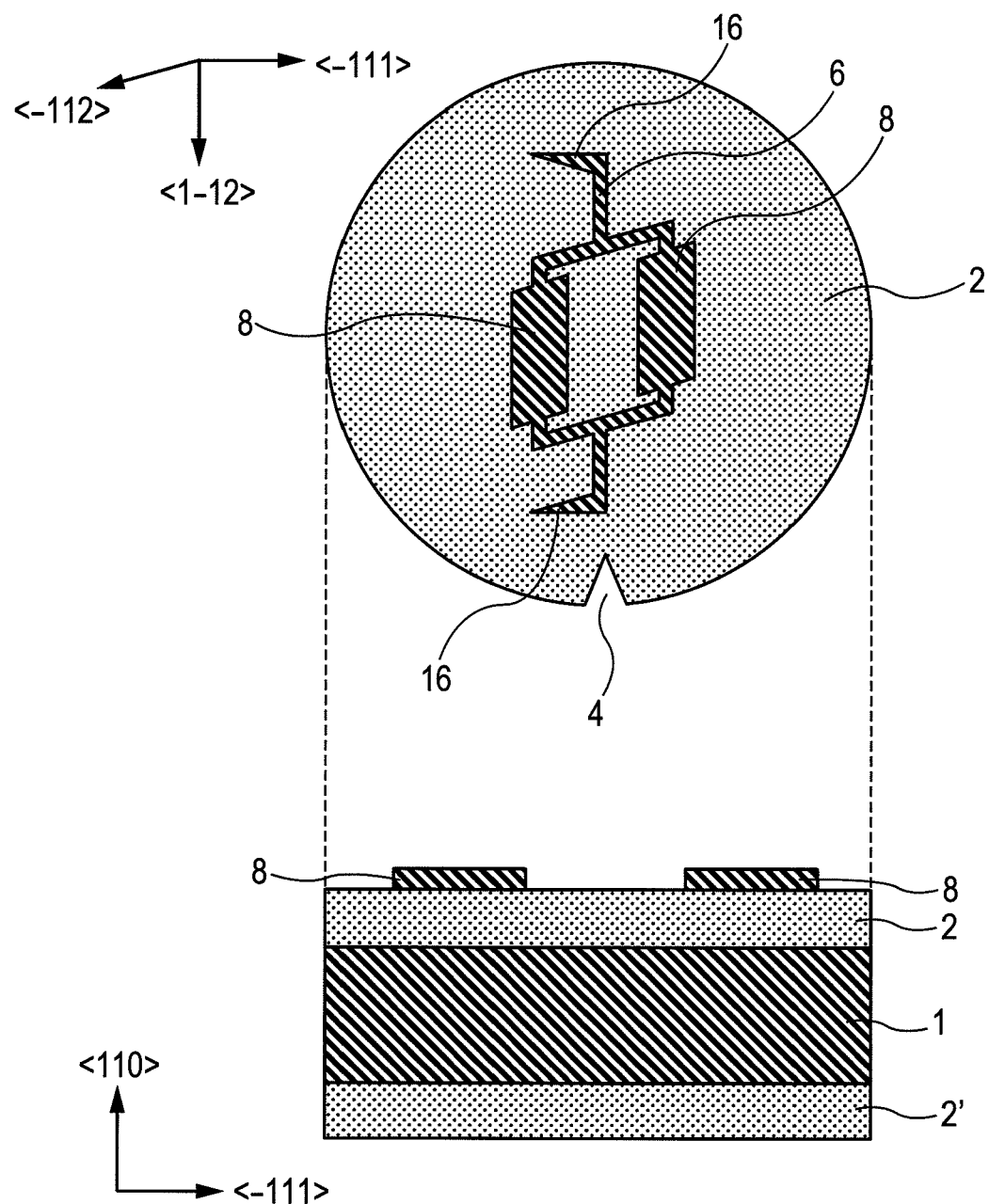
FIG. 9 is a diagram showing a sequence of a manufacturing process of the silicon modulator according to the second embodiment.

Following this, the wet etched silicon dioxide film 5 was removed, and the SOI substrate was made in a state shown in FIG. 9. Thereby, the line edge roughness that arose in the dry etching was able to be eliminated completely.

Figure 10:
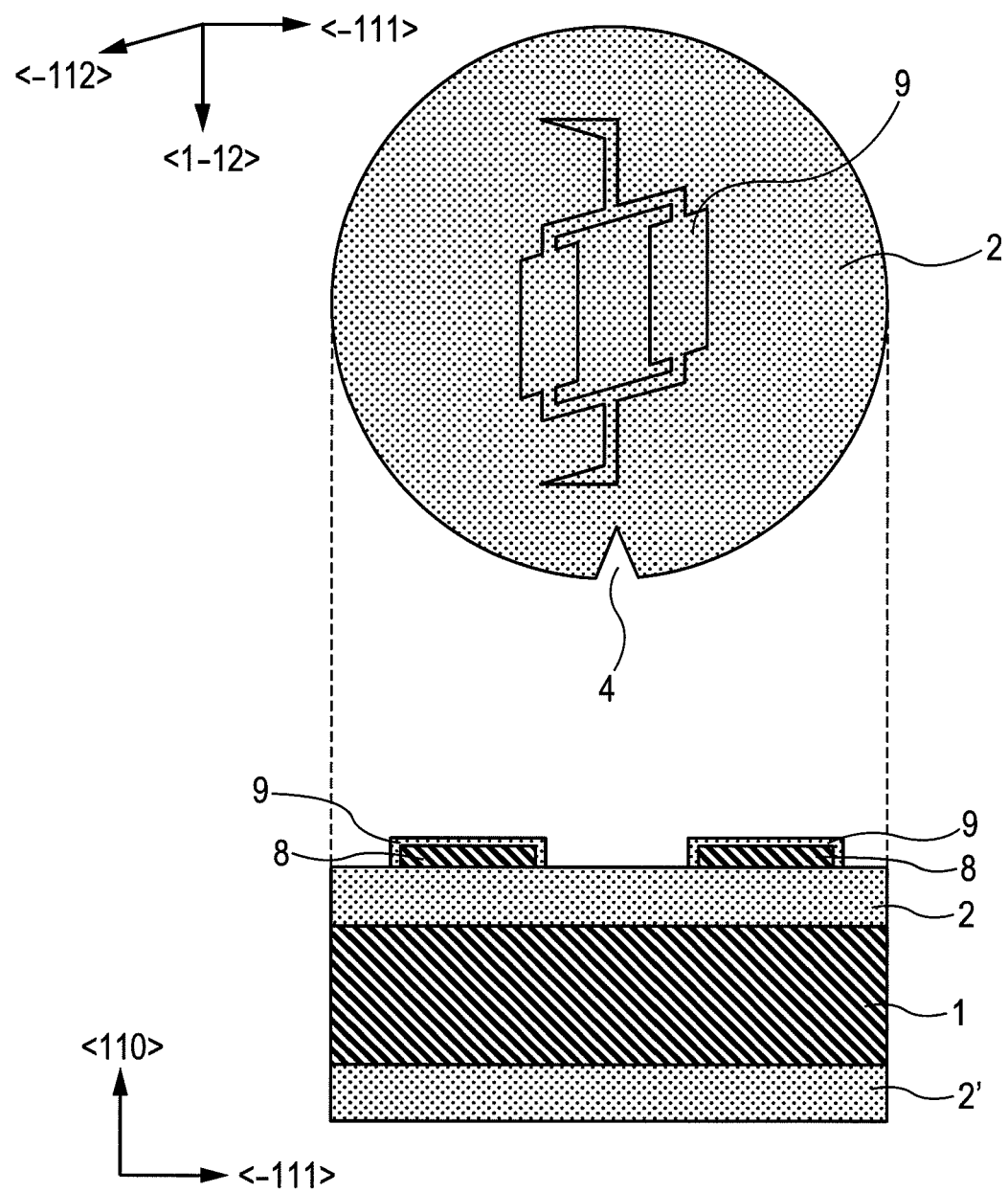
FIG. 10 is a diagram showing a sequence of a manufacturing process of the silicon modulator according to the second embodiment.

Furthermore, the SOI substrate was made in a state where silicon dioxide that was to be a silicon dioxide hard mask 9 whose thickness reached 20 nm was grown by oxidizing the surface again, shown in FIG. 10. Such partial thinning of the layer is for preventing the light propagating in the core of the silicon optical waveguide from being absorbed by an electrode part to cause a loss.

Figure 11:
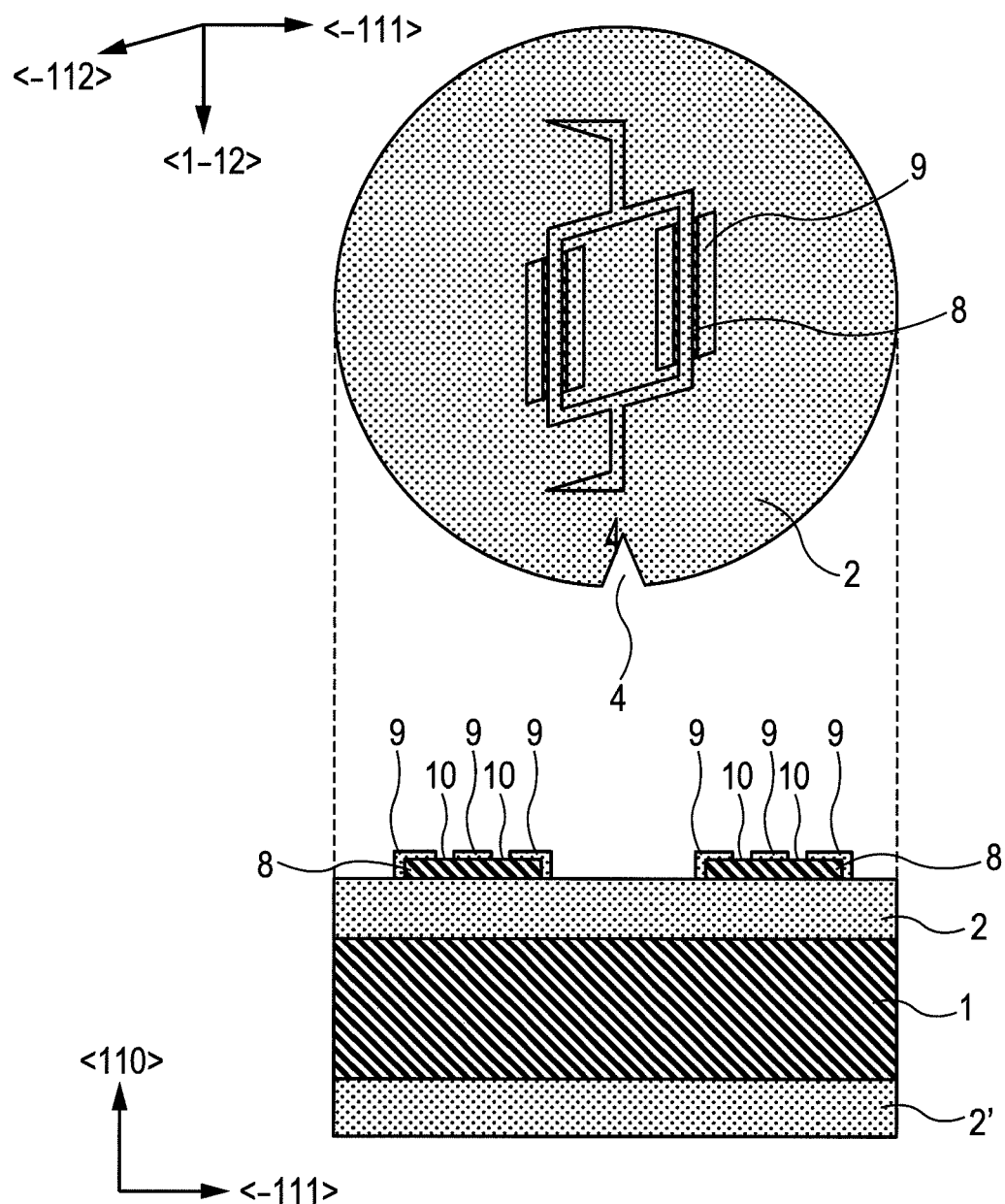
FIG. 11 is a diagram showing a sequence of a manufacturing process of the silicon modulator according to the second embodiment.

Next, the SOI substrate is made in a state where an opening 10 was formed in a desired region of the silicon dioxide hard mask 9 using lithography and the dry etching, shown in FIG. 11.

Figure 12:
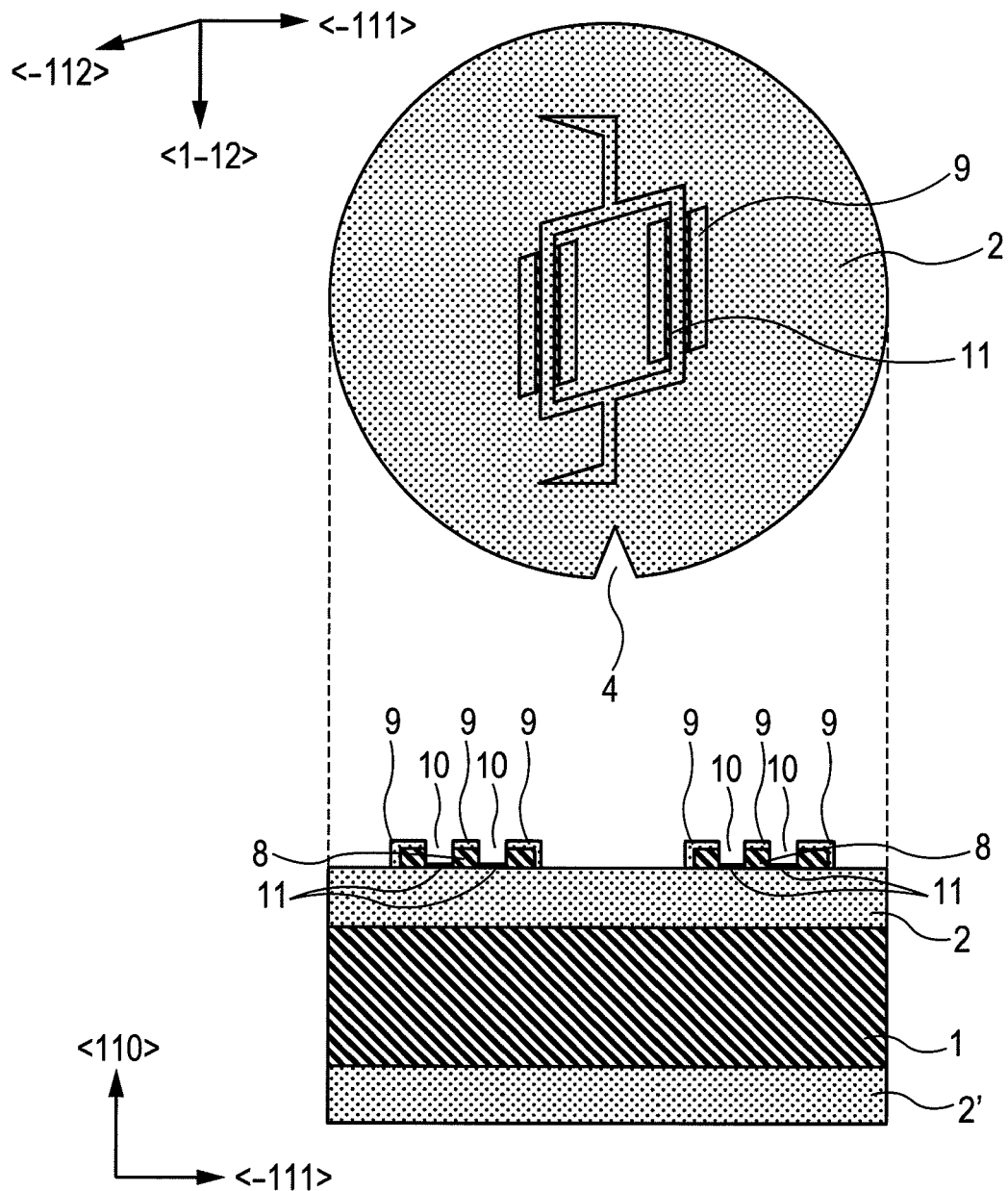
FIG. 12 is a diagram showing a sequence of a manufacturing process of the silicon modulator according to the second embodiment.
Figure 13:
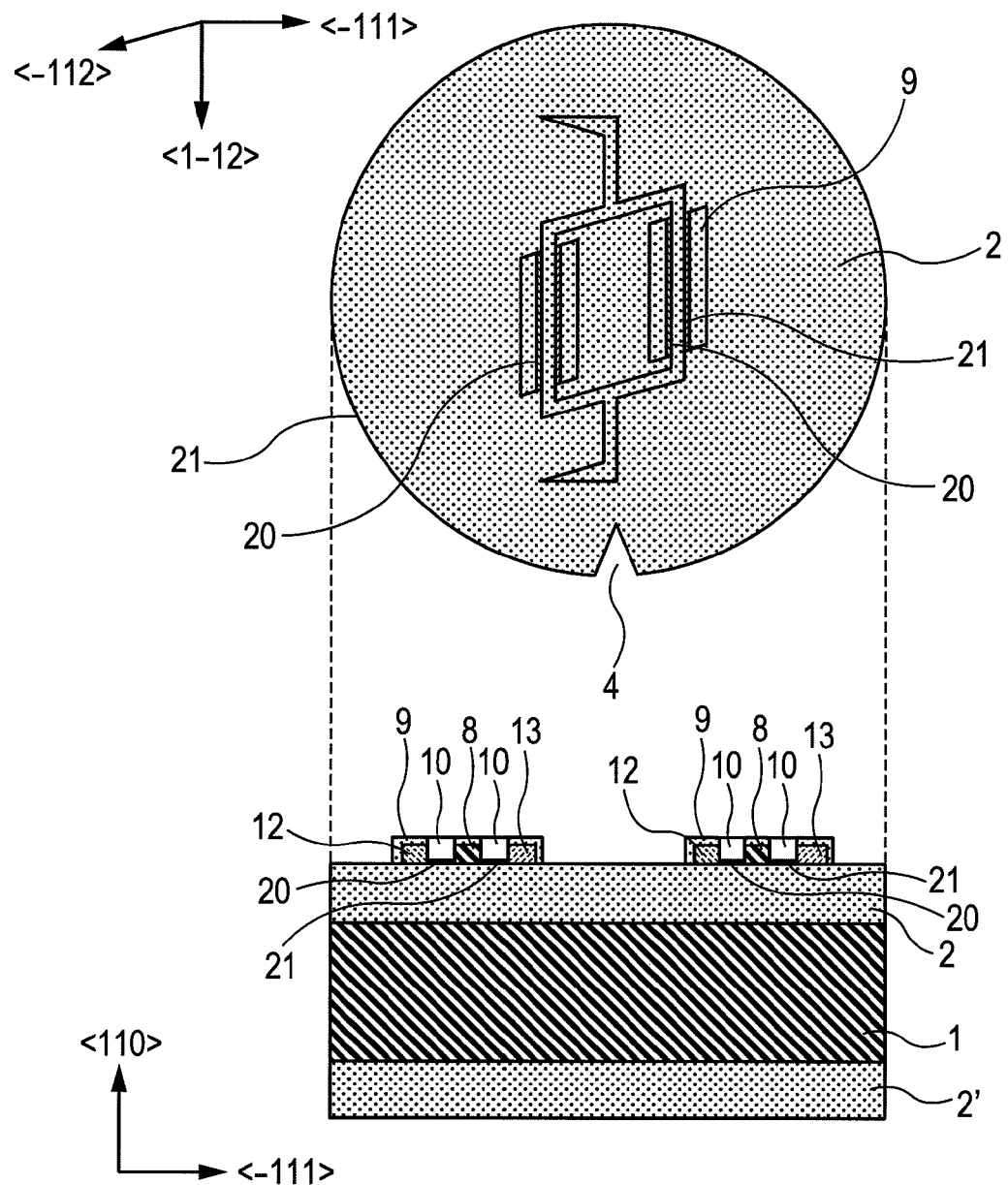
FIG. 13 is a diagram showing a sequence of a manufacturing process of the silicon modulator according to the second embodiment.

Following this, after undergoing a cleaning process, by performing the anisotropic wet etching using an alkaline solution prepared by diluting TMAH (tetramethylammonium hydroxide) under precise time control, the SOI substrate was made in a state where a desired region of the modulation part silicon optical waveguide core 8 was thinned to form a thin film single crystal silicon 11, shown in FIG. 12. Here, in this embodiment, the film thickness of the thin film single crystal silicon 11 was decided to be 30 nm.

Following this, impurities are put into a desired region of the SOI silicon layer through ion implantation. In doing this, the impurities were hardly implanted into the silicon optical waveguide core 8. This is because if high-concentration impurities remain in the optical waveguide part, carriers by impurity doping will absorb the light and generate the loss. When doping impurities, first, silicon dioxide (not illustrated) of a thickness of 20 nm was deposited on the whole surface as a through film by a CVD process, subsequently, a resist was left only in a desired region by the resist patterning using photolithography, then, BF2 (boron difluoride) ions were ion implanted to a dose of $1 \times 10^{15}$ [atoms/cm$^2$], and by the above processes, a p-type diffusion layer electrode 12 and a thin film p-type diffusion layer 20 were formed. Following this, the resist is removed, subsequently, a resist is left only in a desired region by the resist patterning using photolithography again, then, P (phosphorus) ions are ion implanted to a dose of $1\times10^{15}$ [atoms/cm$^2$], and by the above processes, a thin film n-type diffusion layer electrode 21 and an n-type diffusion layer electrode 13 were formed. In these ion implantation processes, since apart of silicon where ions are implanted becomes amorphous, its crystallinity deteriorates. Then, although not shown in the figure, it is important for the conditions to be set so that only the surface of silicon may become amorphous and the silicon optical waveguide core 8 may remain in a crystalline state in a region where the SOI layer (the single crystal silicon film 3) adjoins the BOX layer (the silicon dioxide film 2). If the acceleration voltage of the ion implantation is set too high, since this will make amorphous the whole of the SOI layer (the single crystal silicon film 3) in the region into which ions are implanted, even if a subsequent annealing treatment is done, single crystallinity will not be recovered and the SOI layer will become polycrystal. If adopting such ion implantation conditions as are set in this embodiment, since the SOI layer (the single crystal silicon film 3) in the crystalline state remains in a region that adjoins the BOX layer (the silicon oxide film 2), the crystallinity will be able to be recovered by an activation thermal treatment etc. after the ion implantation. In order to reduce the propagation loss and to acquire an excellent modulation characteristic, the single crystallinity is very important. Following this, by performing an annealing treatment in 900° C. nitrogen atmosphere for 20 minutes, the impurities were activated and, at the same time, the crystallinity of the SOI layer (the single crystal silicon film 3) was recovered. After this, the SOI substrate was made in a state where the through film was removed by a cleaning process, shown in FIG. 13.

Following this, the SOI substrate was made in a state where the silicon dioxide hard mask 9 was removed by the wet etching, shown in FIG. 14.

Next, the SOI substrate was made in a state where the silicon optical waveguide cladding 7 was formed by depositing silicon dioxide to 1000 nm using the CVD system, shown in FIG. 15.

Following this, an opening (not illustrated) was given in a desired region of a part of the silicon optical waveguide cladding 7 by the resist patterning using photolithography and the wet etching. Following this, after a cleaning process, a TiN film and an Al film were deposited on the whole surface, subsequently, a resist was made to remain only in a desired region by the resist patterning using photolithography again, then, the Al film was wet etched using an etching solution containing phosphoric acid, acetic acid, and nitric acid, and after that, the TiN film was wet etched using an etching solution containing ammonia and hydrogen peroxide. As a result, a TiN electrode 14 and an Al electrode 15 were patterned. Following this, the SOI substrate was given a hydrogen annealing treatment at a temperature of 400° C., so that a treatment of terminating defects that arose in the process with hydrogen was performed. By the above process, a device was completed as in a state of FIG. 16.

The optical modulator using the silicon optical waveguide by this embodiment had very low propagation loss and insertion loss as small as 1.0 dB and 1.0 dB, respectively. This is because sidewalls of the silicon optical waveguide are flat at an atomic level, and thereby scattering resulting from the line edge roughness is suppressed. Moreover, when it was put in a modulation operation at high speed, it operated up to 20 GHz in a 3-dB bandwidth. Moreover, a structure of the optical modulator according to this embodiment was such that its optical path lengths were equal correctly, and it rotational angles accompanying the bending became each 360° in total, and an extinction ratio of 10 dB or more was able to be secured, although right and left portions thereof are non-inverted symmetrical.

Third Embodiment

The first embodiment and the second embodiment disclosed the low-loss and polarization independent silicon optical waveguide that has only the (111) plane as its sidewalls, the optical modulator using the silicon optical waveguide, and the production methods of them. In these embodiments, since the line edge roughness of the silicon optical waveguide was reduced and the sidewalls were flat at an atomic level, it was able to make the loss extremely small. On the other hand, it is necessary to limit a propagation direction of the silicon optical waveguide to two directions, the <1-12> direction and the <-112> direction making an angle of 70.5° to it, and therefore there is a problem that a freedom of an optical circuit design falls. Therefore, this embodiment discloses a low-loss and polarization independent silicon optical waveguide that does not cause such a fall of the freedom of the optical circuit design and an effective loss of light is suppressed to a minimum, a modulator, and a production method of them.

Although an embodiment of the modulator that is an active optical circuit will be disclosed, it goes without saying that the present invention can be applied to the silicon optical waveguide, an optical multiplexer/demultiplexer, etc. that are passive optical circuits. In this embodiment, since there are many portions common to the second embodiment in trial manufacture processes, an explanation will be focused to main points of the trial manufacture and will be given plainly.

Figure 22:
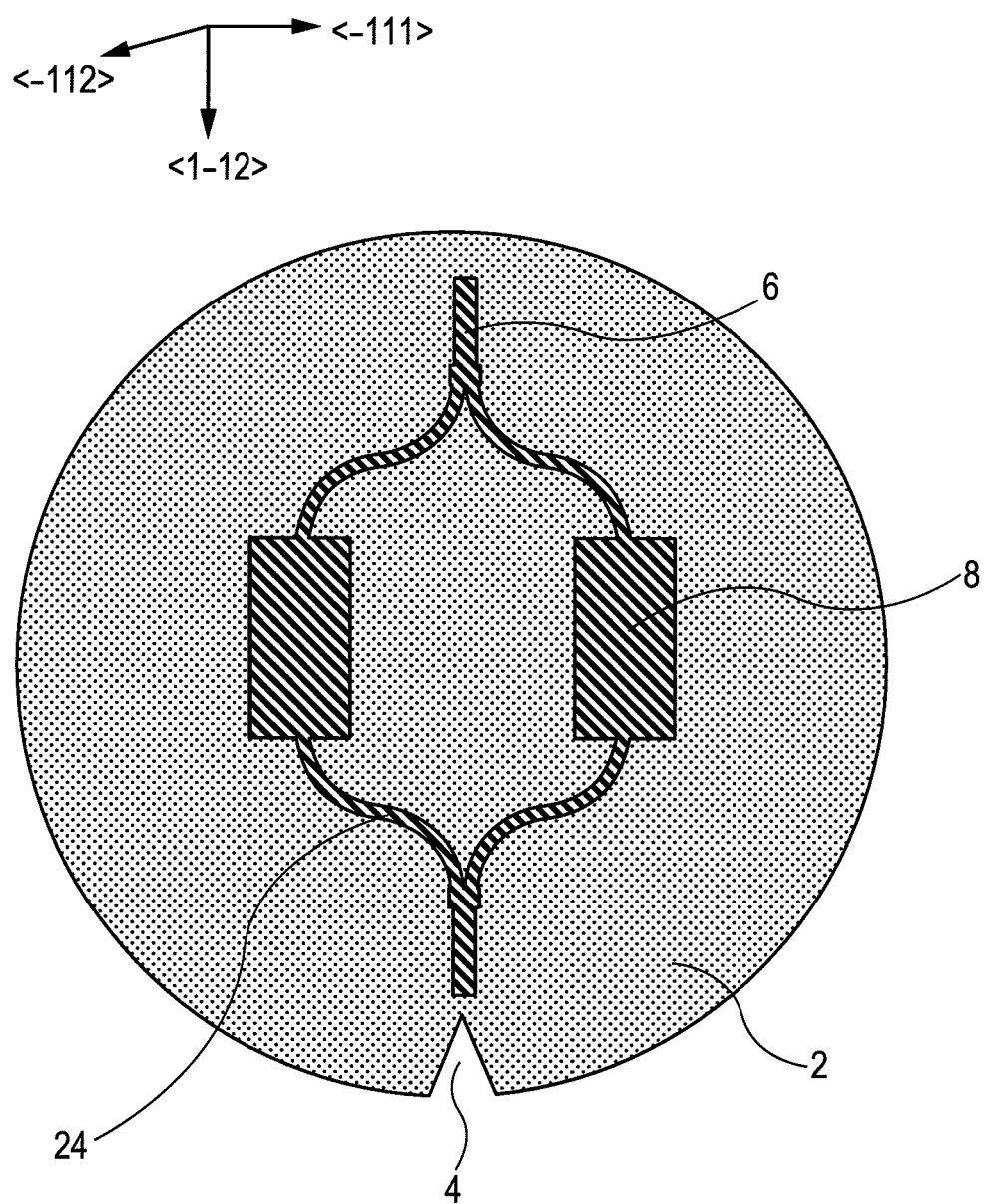
FIG. 22 is a diagram showing a sequence of a manufacturing process of a silicon modulator according to a third embodiment as seen from its upper part.

First, after preparing the SOI substrate like the second embodiment, it was made in a state of FIG. 22 where the single crystal silicon film 3 was processed by usual photolithography and the dry etching. Since the dry etching is used for processing of the single crystal silicon film 3, the sidewalls of the silicon optical waveguide core 6 have the line edge roughness. Here, a design was made assuming that a curvilinear bend section 24 has a radius of curvature of 1 µm. Since the refractive index 3.5 of silicon that serves as the optical waveguide core is overwhelmingly large compared with the refractive index 1.45 of silicon dioxide that is the cladding, if the waveguide is bent into such a small radius of curvature, the loss will be as small as cannot be measured. In the figure, although in order to understand easily, the curvilinear bend section 24 was drawn exaggerating the size thereof, an optical waveguide distance of the curvilinear bend section 24 is a few µm at most, and this distance is only about ¹⁄₁₀,₀₀₀ of about 1 cm that is a total optical waveguide distance of the whole optical circuit. Therefore, the line edge roughness of the bend section hardly exerts an influence on the loss.

Figure 23:
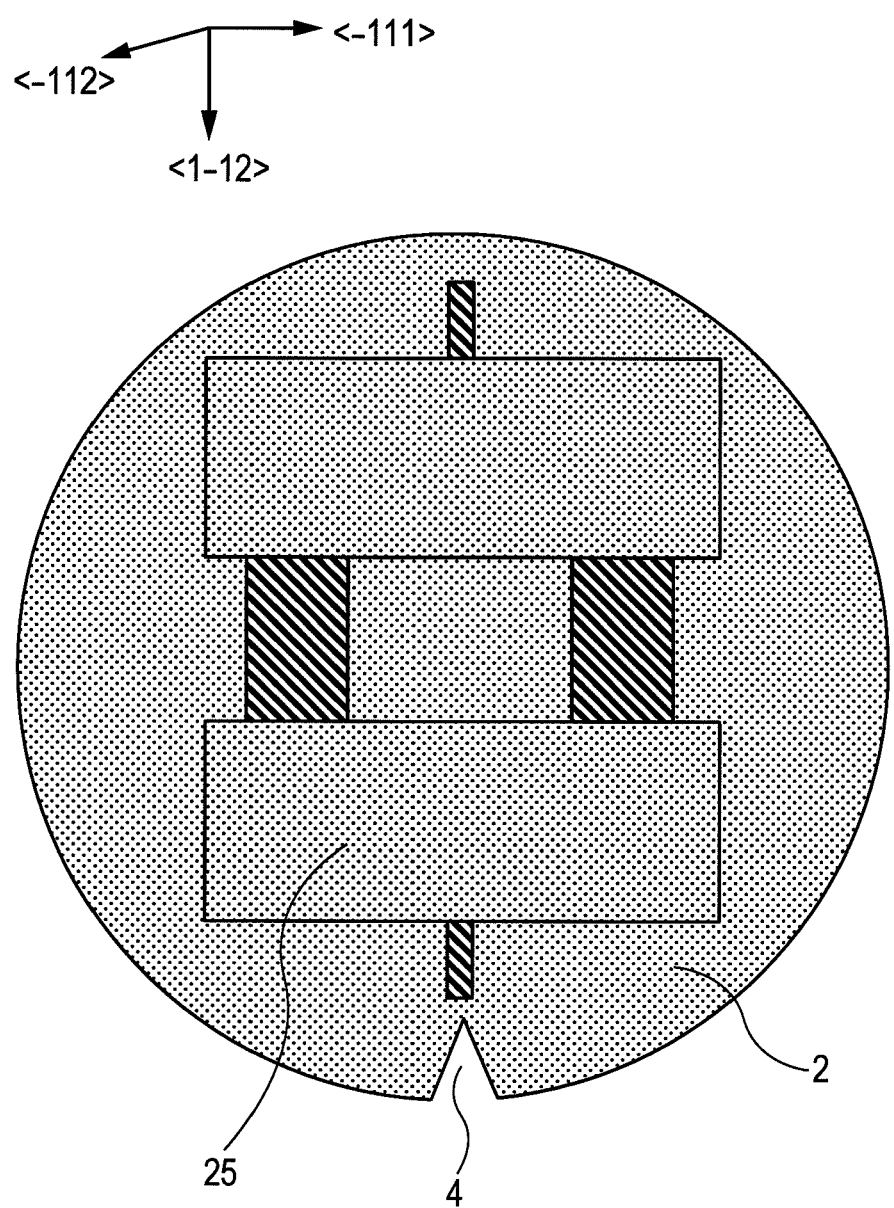
FIG. 23 is a diagram showing a sequence of a manufacturing process of the silicon modulator according to the third embodiment as seen from its upper part.

Next, in order to reduce the propagation loss in the <1-12> direction and the <-112> direction that occupy a greater portion of the silicon optical waveguide core 6, the sidewalls are planarized. For this purpose, after depositing silicon dioxide on the whole surface to 20 nm by CVD, the SOI substrate was made in a state of FIG. 23 where a silicon dioxide hard mask 25 is processed to a desired shape by the wet etching. Here, the silicon dioxide hard mask 25 is designed to cover the silicon optical waveguide core 6 that has the principal axis in an arbitrary direction that does not head to the curvilinear bend section 24, the <1-12> direction, or the <-112> direction. A reason of using the wet etching for this processing process is that if anisotropic dry etching is used, "side wall" will be formed on the sidewalls, which inhibits a planarizing treatment for forming the (111) plane by the anisotropic alkaline wet etching that is performed successively, and the wet etching is intended to prevent the planarizing treatment from being inhibited.

Next, after undergoing a cleaning process, the anisotropic wet etching using an alkaline solution prepared by diluting TMAH (tetramethylammonium hydroxide) is performed, so that a portion of the sidewalls where silicon is exposed on that sidewalls is made into the (111) plane, and is planarized at an atomic level simultaneously. Following this, the silicon dioxide hard mask 25 was removed by the wet etching with a solution containing hydrofluoric acid. Thereby, the SOI substrate was made in the same state as FIG. 14 that is a sectional view shown in the second embodiment.

Processes after this are completely the same processes as those of the method disclosed in the second embodiment, and manufacturing processes such that sectional structures were shown in FIG. 14 to FIG. 16 are performed. That is, they are partial thinning of the modulation part silicon optical waveguide core 8 for preventing optical absorption in the electrode part, the ion implantation and activation, deposition of silicon dioxide serving as cladding, a wiring process, and hydrogen annealing for inactivation. A sectional view of an element finished structure as a result of these processes is the same as FIG. 16. However, it goes without saying that a design shape of the silicon optical waveguide core 8 as seen from the upper part has become as shown in FIG. 22.

In this embodiment, although after branching the silicon optical waveguide core 8 to forked waveguides, pin junctions were formed in both paths to make symmetry high, it is all right that a pin junction is formed in one or the other path for modulation.

Thus, as a result of manufacture in this way, the propagation loss became 0.5 dB, being improved from a trial manufacture result of the second embodiment. Moreover, the extinction ratio was also improved to 15 dB or more. This is considered because the bend loss at the forked branch part and the loss caused by steep bending are decreased. From the above result, it becomes possible to design the silicon optical waveguide directed in an arbitrary direction and, at the same time, to decrease the optical losses.

Fourth Embodiment

This embodiment discloses a germanium light emitting device (germanium laser diode) that can easily be formed on a substrate, such as silicon, using a normal silicon process, emits light efficiently, and uses a distributed feed-back (abbreviated as DFB) structure as a resonant structure, and its production method. Before doing it, importance of the germanium light emitting device and a background of the invention will also be explained briefly.

As described above, long-distance information communications are performed by optical communications, and compound semiconductors are used for optical devices therefor. Although the laser fabricated with a compound semiconductor is very efficient, its integration is not progressed because the compound semiconductor is an expensive material, and the material is formed with multiple elements and is hard to control.

On the other hand, in the case of a device using silicon, a high-quality single crystal silicon substrate is easily available, which enables multiple devices to be fabricated with a yield almost close to 100%, and therefore it becomes possible to increase the yield as a chip to a realistic level in economical point of view even if a large number of devices are integrated on the same chip. Therefore, there is a desire that a light emitting device and a light receiving device that are highly-efficient and are based on group IV semiconductors, such as silicon and its equivalence, germanium, are produced cheaply and reliably in a silicon process line whose infrastructure has been well arranged. However, one that makes silicon itself emit light as is disclosed by Japanese Patent Unexamined Application Publication. No. 2007-294628 has a problem that if light from the silicon light emitting device leaks from the optical waveguide, the light may be absorbed by a portion of silicon that is mounted on an electronic circuit, which may cause an erroneous operation in the electronic circuit.

If it is germanium, since its band gap is smaller than that of silicon, luminescence from germanium whose quantum confinement effect is small will not be absorbed by silicon, and therefore there will be no fear of giving a malfunction to the electronic circuit. However, in order to perform high-speed information transmission by light using a light emitting device based on germanium, it is insufficient just to make it emit light as an LED (Light-Emitting Diode), and it is necessary to make it perform laser oscillation as an LD (Laser Diode). If the laser oscillation can be performed, not only it is possible to directly modulate it at high speed, but also it becomes possible to be used for a purpose of optical wiring between chips or inside a chip because laser light travels with, directivity in an optical waveguide. However, in order to make it perform the laser oscillation, it is necessary not only to convert a current into light but also to form a resonator structure for confining light efficiently in a part that emits the light.

Moreover, in realizing a semiconductor laser that uses germanium as a luminous layer, quality of the crystallinity of germanium becomes important. Although it is possible to acquire a substrate of germanium single crystal, a germanium substrate is hardly used in the current silicon process, and therefore it is not realistic to use the germanium substrate when considering uses, such as mixed installation with the electronic circuit. On the other hand, in the case of using the silicon substrate or the SOI (Silicon On Insulator) substrate, a technology of growing germanium epitaxially on silicon becomes needed. However, since silicon and germanium are largely different in lattice constant, if germanium is grown epitaxially directly on silicon, a large number of crystal defects, dislocations, etc. will arise. In the situation where a large number of such crystal defects exist, since carriers suffer nonradiative recombination in the vicinity of the defect, a laser oscillation cannot be performed. Moreover, in the case of using germanium in which a large number of crystal defects existed as a light receiving device, there was a problem that, since the defect easily generated an electron and hole pair, a dark current flowing even when light was not incident increased, which increased a power consumption at the time of standby. Japanese Patent Application Publication No. 2006-351612 discloses a concentrated oxidation method as a method for forming a high-quality germanium layer on the SOI substrate. This is a technology of forming a GOI (Germanium ON Insulator) substrate by growing epitaxially SiGe whose germanium concentration is thin so that no crystal defects occur, subsequently selectively oxidizing silicon by oxidizing its surface, and thickening the concentration of germanium that is left without being oxidized. However, this technology is premised on application to an LSI, and has a problem that it can form only extremely thin Ge as of a film thickness of a few nm and therefore it cannot be applied to a light emitting or light receiving device that needs a film thickness of some amount. That is, germanium that has a sufficient film thickness as can be used for the light emitting device and the light receiving device and has a very high quality of the crystallinity must be formed on the silicon substrate or the SOI substrate.

One that solves these is this embodiment and its detailed structure and a production method thereof will be shown below.

FIG. 24A to FIG. 24I and FIG. 25A to FIG. 25I show sectional structures in a sequence of manufacturing processes. Moreover, FIG. 26A to FIG. 26I show schematic diagrams in the sequence of the manufacturing processes as seen from the upper part of the substrate. Here, FIG. 24A to FIG. 24I are respective sectional views in the transverse direction of FIG. 26A to FIG. 26I, and, for example, FIG. 24I shows a sectional structure when cutting is done along a cutting line 37 in FIG. 26I. Moreover, FIG. 25A to FIG. 25I are respective sectional views in the transverse direction of FIG. 26A to FIG. 26I, and, for example, FIG. 25I shows a sectional structure when cutting is done along a cutting line 38 in FIG. 26I. The cutting lines 37 and 38 intersect perpendicularly to each other, the cutting line 37 extends in an X-direction in the diagram, and the cutting line 38 extends in a Y-direction in the diagram. The completion drawings of the device in this embodiment are FIG. 24I, FIG. 25I, and FIG. 26I.

Hereinafter, manufacturing processes will be explained step by step.

Figure 24A:
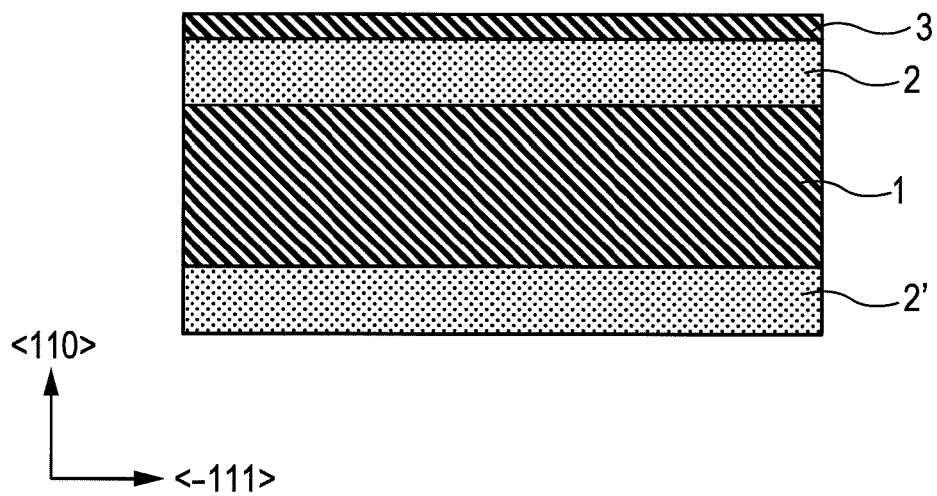
FIG. 24A is a sectional view showing a sequence of a manufacturing process of a germanium laser diode according to a fourth embodiment.
Figure 25A:
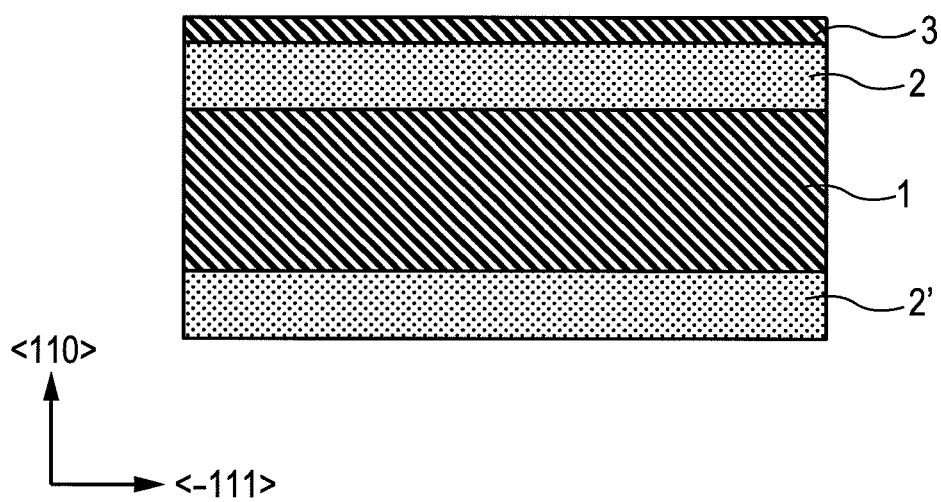
FIG. 25A is a sectional view showing a sequence of a manufacturing process of the germanium laser diode according to the fourth embodiment.
Figure 26A:
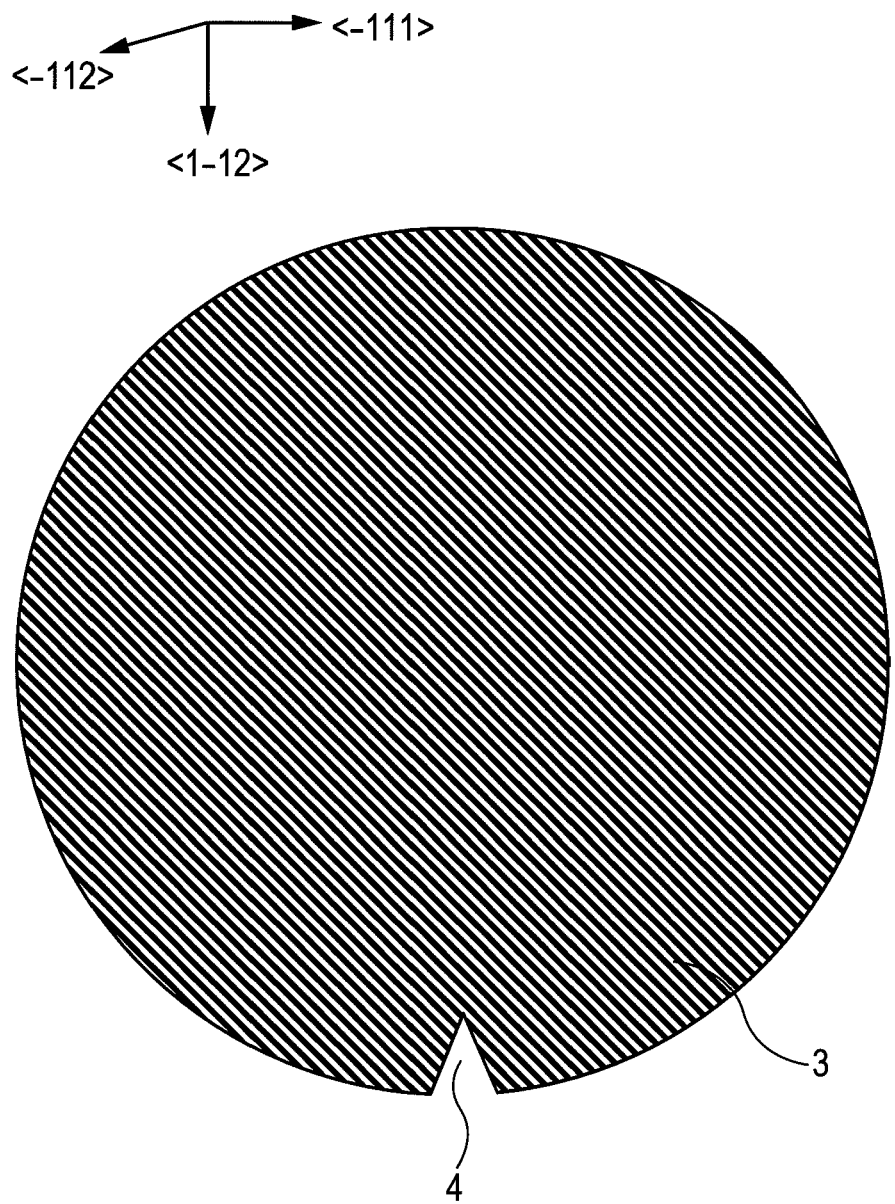
FIG. 26A is a diagram of a sequence of a manufacturing process of the germanium laser diode according to the fourth embodiment as seen from its upper part.

First, as shown in FIG. 24A, FIG. 25A, and FIG. 26A, the SOI substrate in which the silicon substrate 1 serving as the supporting substrate, the silicon dioxide film 2 serving as an embedding insulator film, the single crystal silicon film 3 serving as a semiconductor film are layered in this order is prepared. Here, it is assumed that the plane orientation of the surface of the single crystal silicon film 3 is the (110) plane. Moreover, as shown in FIG. 26A, a cut that is called the notch 4 is formed on the SOI substrate at a position of the wafer end face in a direction such that a crystalline direction becomes the <1-12> direction when seeing it from the center of the SOI substrate. An initial thickness of the silicon film 3 trial-manufactured in this embodiment before the process was 300 nm. Moreover, the film thickness of the silicon dioxide film 2 was 2000 nm.

Figure 24B:
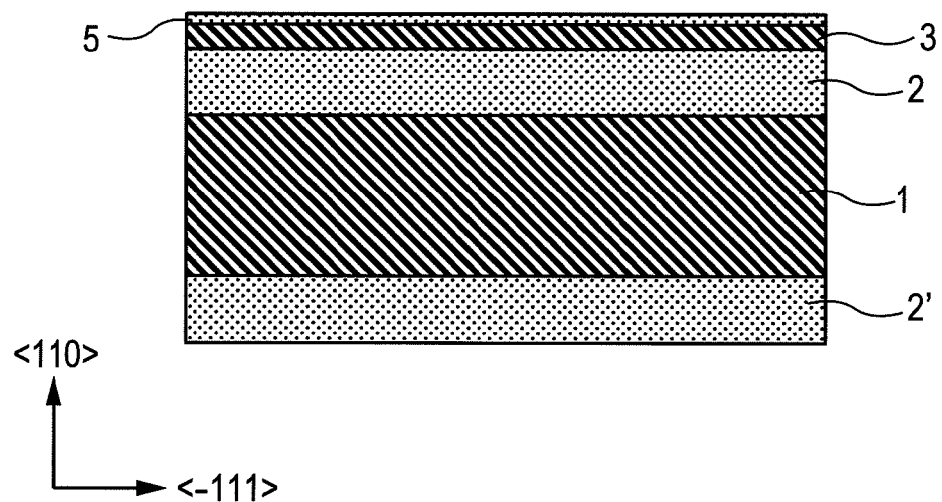
FIG. 24B is a sectional view showing a sequence of a manufacturing process of the germanium laser diode according to the fourth embodiment.
Figure 25B:
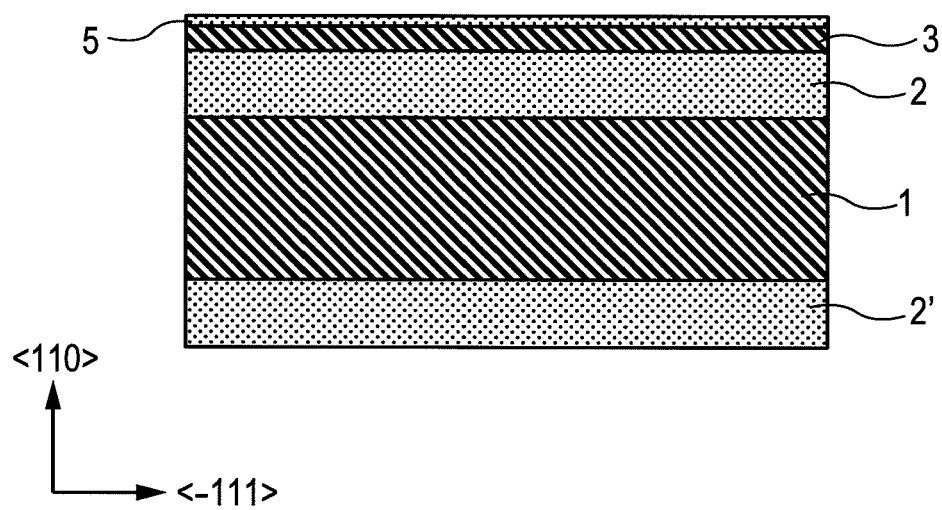
FIG. 25B is a sectional view showing a sequence of a manufacturing process of the germanium laser diode according to the fourth embodiment.
Figure 26B:
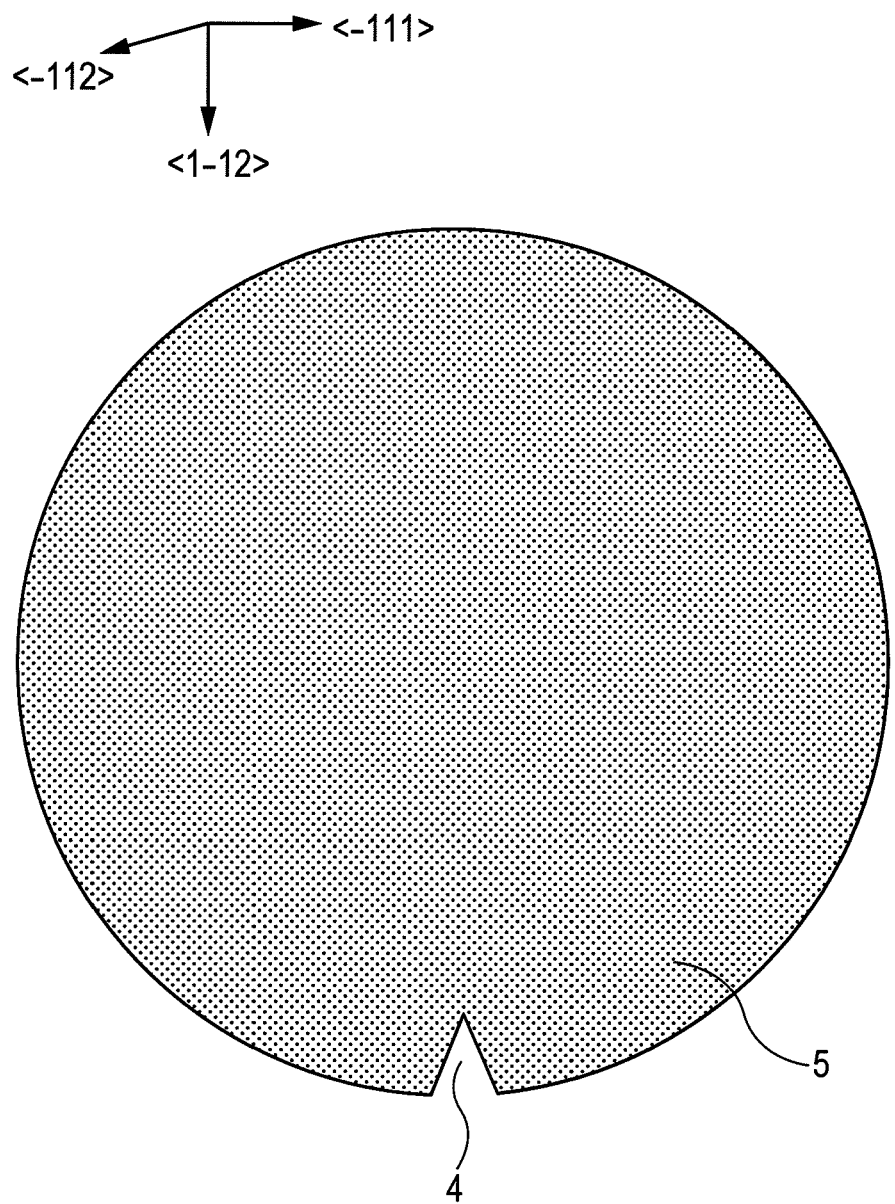
FIG. 26B is a diagram of a sequence of a manufacturing process of the germanium laser diode according to the fourth embodiment as seen from its upper part.

Next, after cleaning the prepared SOI substrate, the SOI substrate is made in a state where the silicon dioxide film 5 is grown thereon to a thickness of 20 nm by oxidizing its surface, shown in FIG. 24B, FIG. 25B, and FIG. 26B.

Figure 24C:
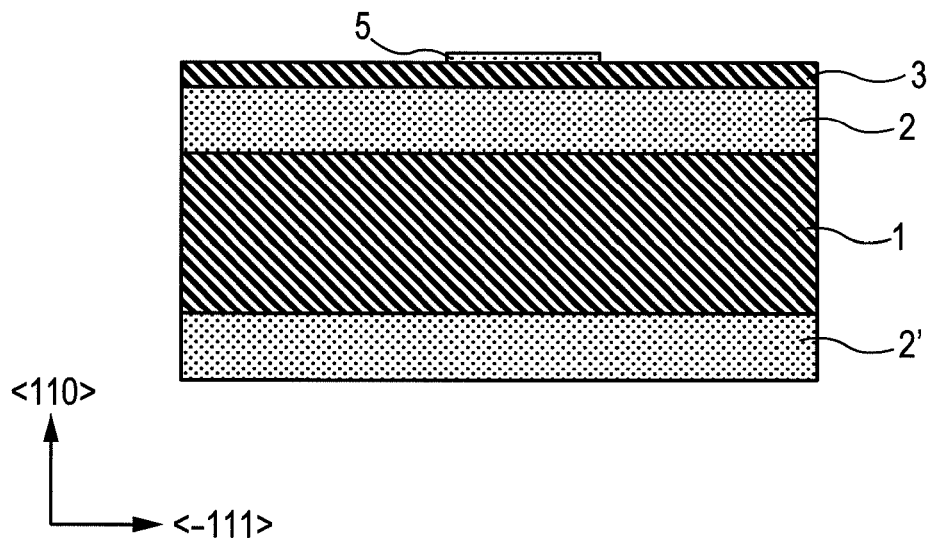
FIG. 24C is a sectional view showing a sequence of a manufacturing process of the germanium laser diode according to the fourth embodiment.
Figure 25C:
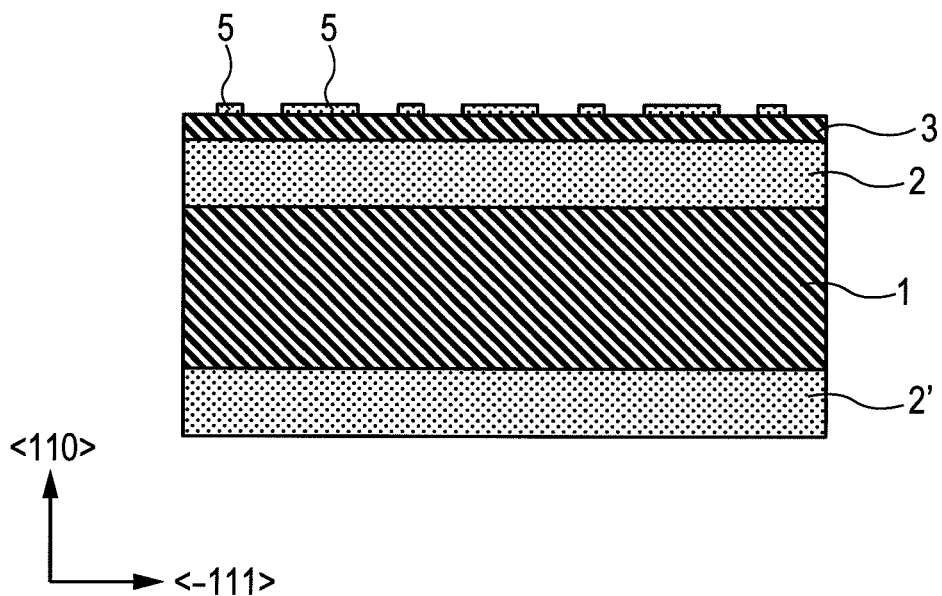
FIG. 25C is a sectional view showing a sequence of a manufacturing process of the germanium laser diode according to the fourth embodiment.
Figure 26C:
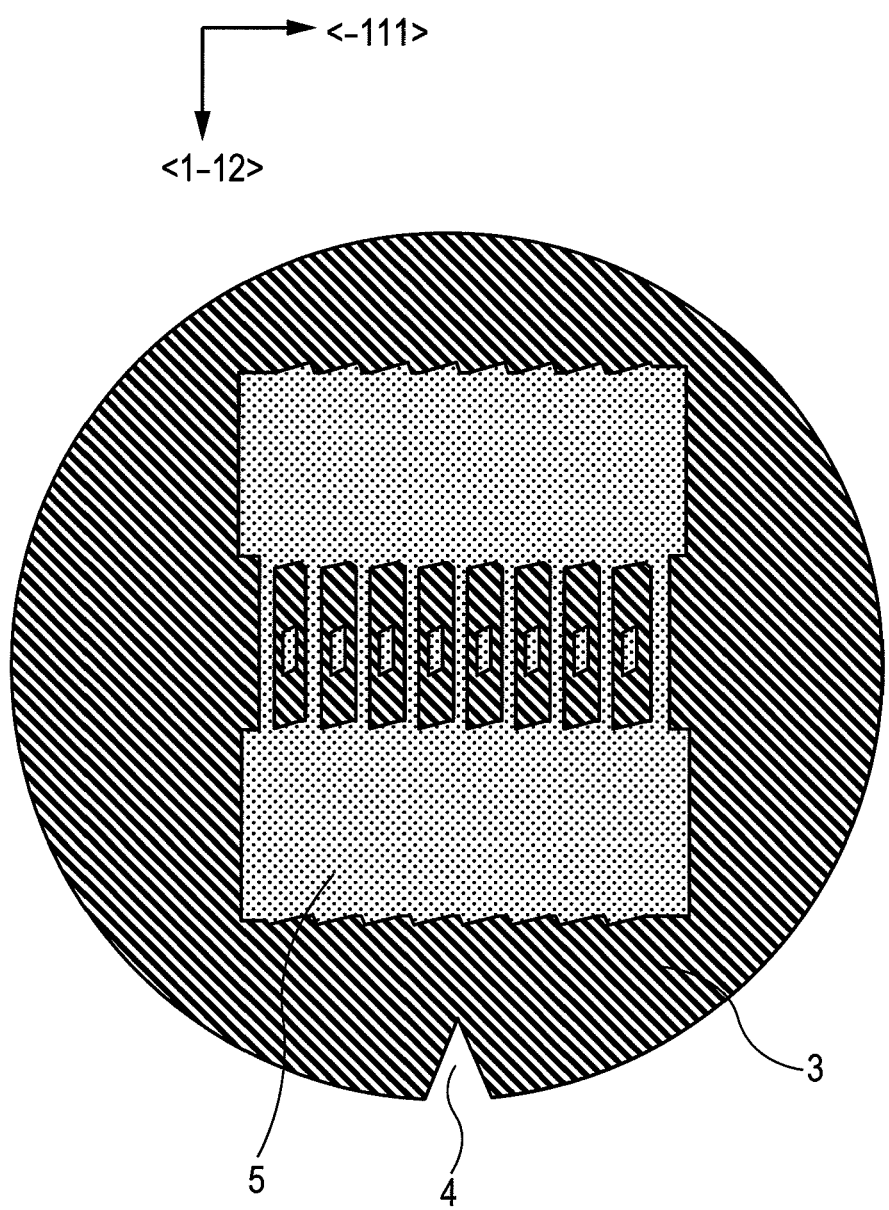
FIG. 26C is a diagram of a sequence of a manufacturing process of the germanium laser diode according to the fourth embodiment as seen from its upper part.

Next, a hard mask is formed by processing the silicon dioxide film 5 to a desired shape using the resist patterning using photolithography and the dry etching, and subsequently the SOI substrate was made in a state where the resist is removed by the asher, shown in FIG. 24C, FIG. 25C, and FIG. 26C. As shown in FIG. 26C, the SOI substrate is designed in advance so that the sidewalls of the fin structure of silicon that are finally formed may be a crystalline plane equivalent to the (111) plane. That is, a major axis of the fin structure of silicon was set to the <1-12> direction. Similarly, it is all right to chose the <-112> direction. Although the SOI substrate is drawn in FIG. 26C without emphasizing the unevenness of the line edge roughness described in the first embodiment, it goes without saying that roughness of about a few nm has arisen on the side faces of the hard mask.

Figure 24D:
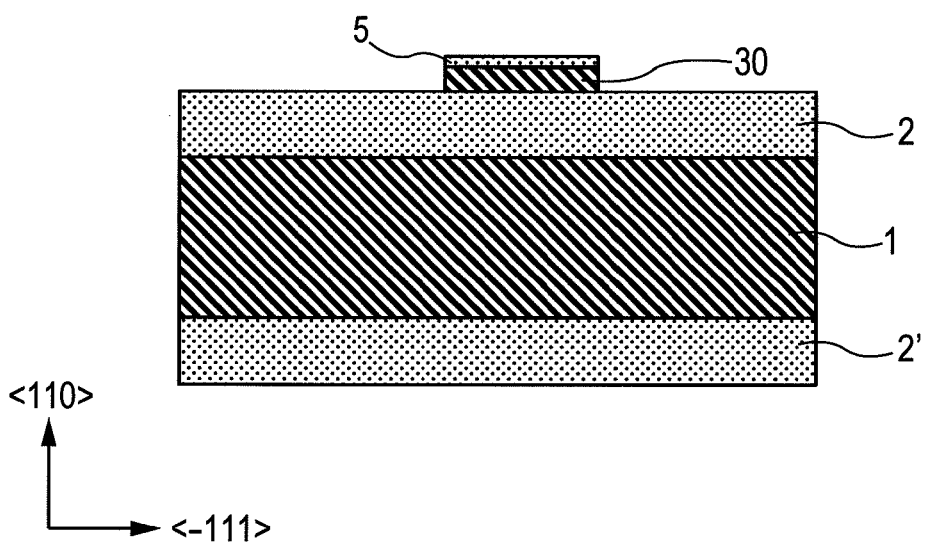
FIG. 24D is a sectional view showing a sequence of a manufacturing process of the germanium laser diode according to the fourth embodiment.
Figure 25D:
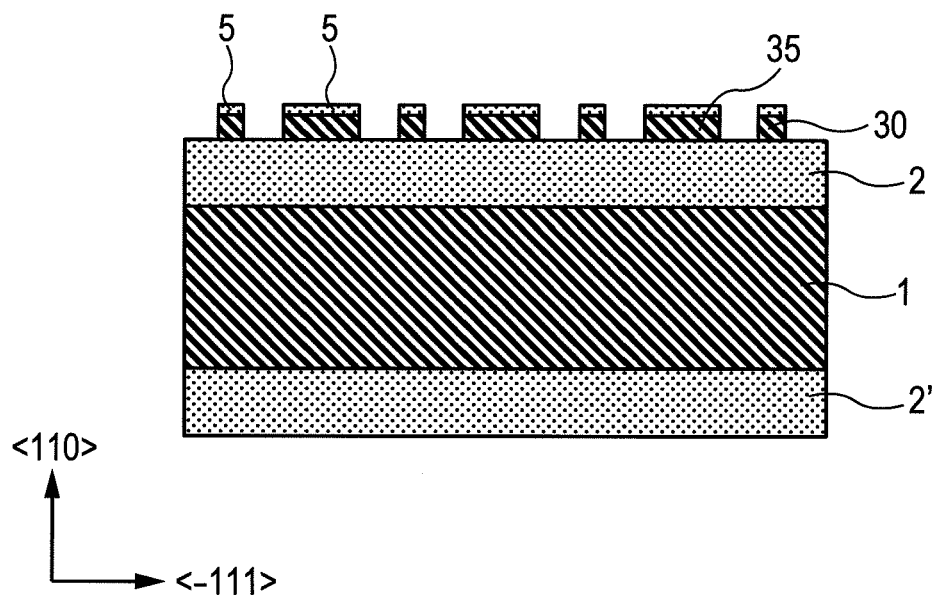
FIG. 25D is a sectional view showing a sequence of manufacturing process of the germanium laser diode according to the fourth embodiment.
Figure 26D:
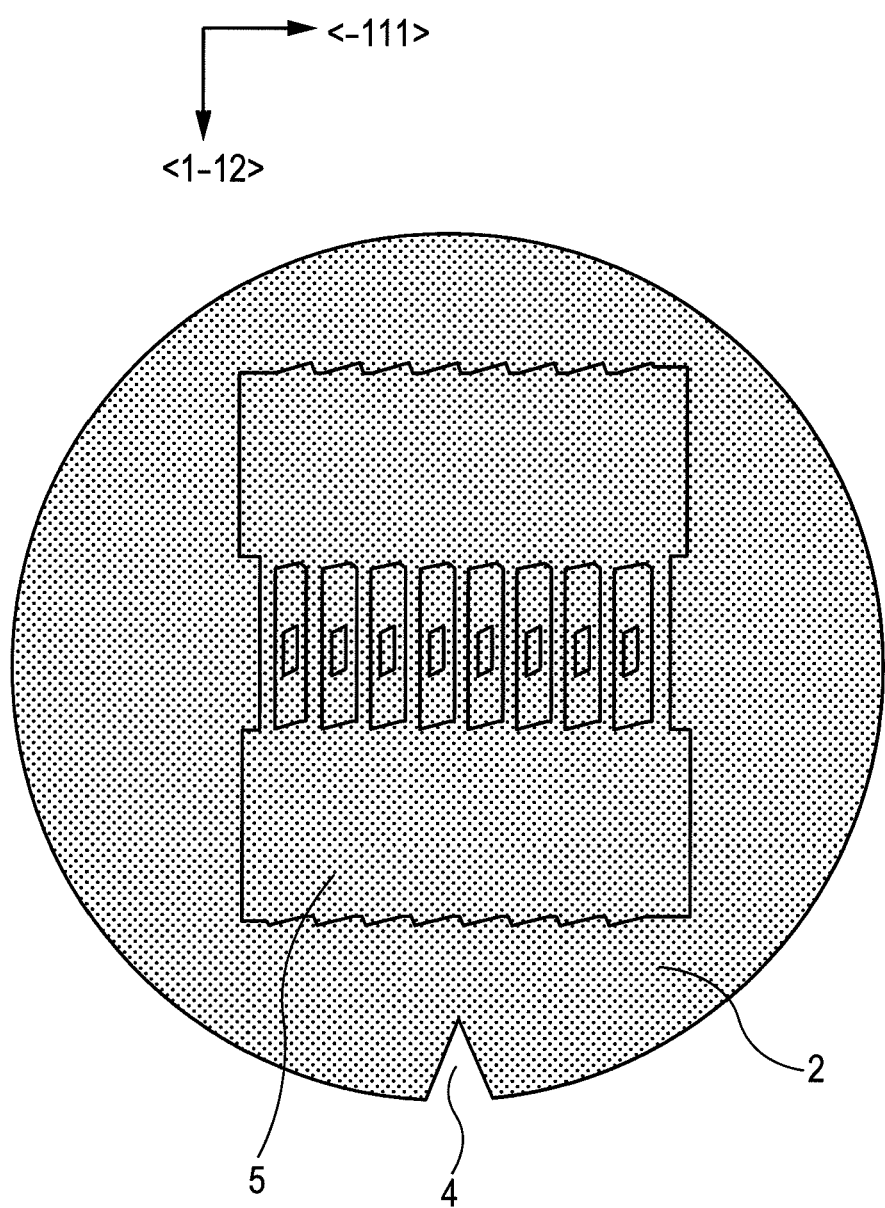
FIG. 26D is a diagram of a sequence of a manufacturing process of the germanium laser diode according to the fourth embodiment as seen from its upper part.

Following this, after undergoing a cleaning process, the anisotropic wet etching using an alkaline solution prepared by diluting TMAH (tetramethylammonium hydroxide) was performed, and the SOI substrate was made in a state where patterning of fin-shaped silicon 30 and a silicon optical waveguide core 35 was performed, and at the same time, the (111) plane was exposed on the sidewall parts of them, shown in FIG. 24D, FIG. 25D, and FIG. 26D. Here, the fin-shaped silicon 30 and the silicon optical waveguide core 35 are arranged periodically, and are designed so that a period obtained by adding widths and spacings of the fin-shaped silicon 30 and the silicon optical waveguide core 35 may become a half of wavelength in these media that is set by an average refractive index neff in the media to an emission wavelength $\lambda\text{eff}=\lambda/\text{neff}$ (nm), i.e., $\lambda\text{eff}/2=\lambda/\text{neff}/2$ (nm). An arrangement other than this may do, for example: an arrangement where multiple fin-shaped silicon 30 exist in the half of wavelength $\lambda\text{eff}=\lambda/\text{neff}$, i.e., $\lambda\text{eff}/2=\lambda/\text{neff}/2$ (nm). Anyway, in order to manufacture a resonator of the DFB structure, a cycle in the periodical structure that is made with the fin-shaped silicon 30 and the silicon optical waveguide core 35 needs to be an integral multiple of a half of $\lambda\text{eff}=\lambda/\text{neff}$, i.e., $\lambda\text{eff}/2=\lambda/2\cdot\text{neff}$ (nm). In this embodiment, the width of the fin-shaped silicon 30 was set to 20 nm. In the drawings shown in this embodiment, only a few (at most) fin-shaped silicon 30 and silicon optical waveguide cores 35 are described, but practically, a structure in which one thousand of fin-shaped silicon 30 and silicon optical waveguide cores 35 were aligned was trial-manufactured. Thereby, the effective number of quantum wells was able to be increased, so that the film thickness of the quantum wells was successfully gained.

Moreover, although this embodiment disclosed a distributed feed-back light emitting device in which a mirror is placed in the optical waveguide, it is all right that the embodiment takes a type of DBR in which a mirror part is placed outside the fin.

Figure 24E:
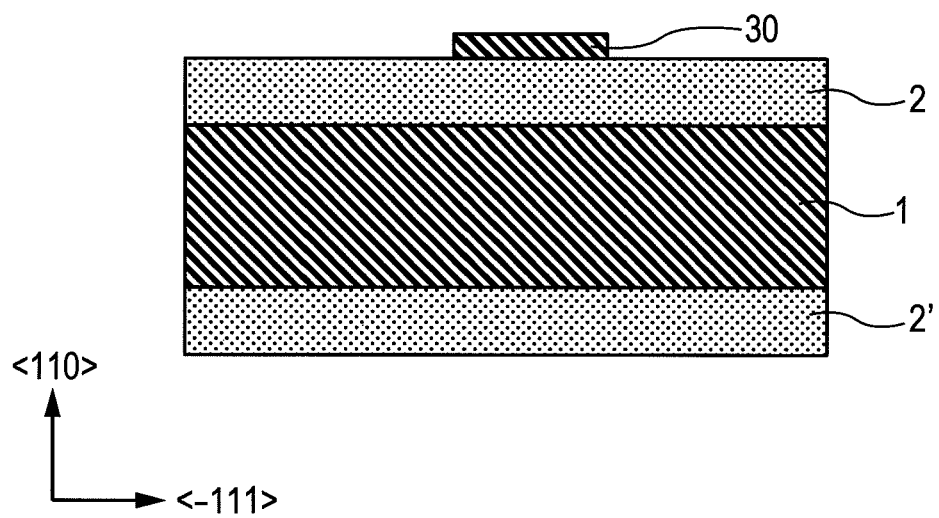
FIG. 24E is a sectional view showing a sequence of a manufacturing process of the germanium laser diode according to the fourth embodiment.
Figure 25E:
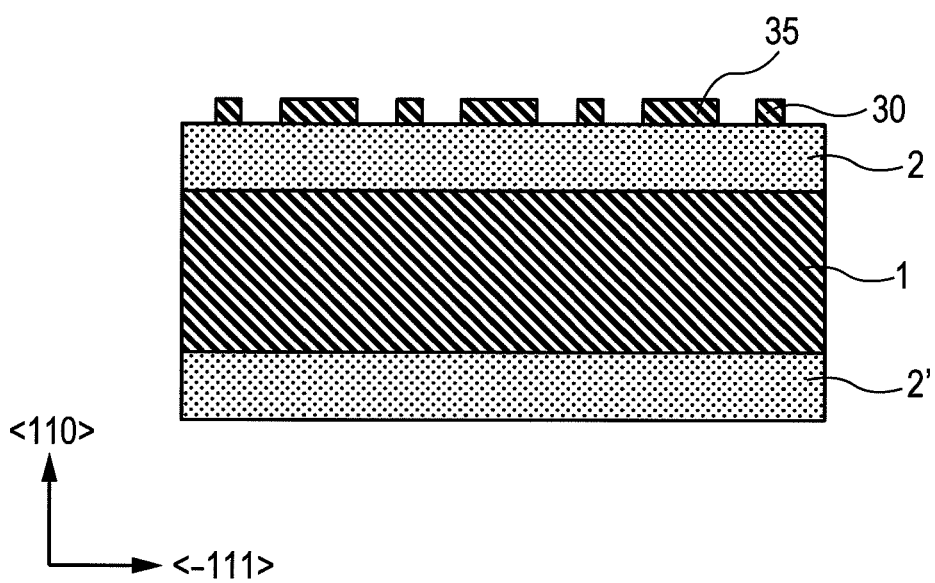
FIG. 25E is a sectional view showing a sequence of manufacturing process of the germanium laser diode according to the fourth embodiment.
Figure 26E:
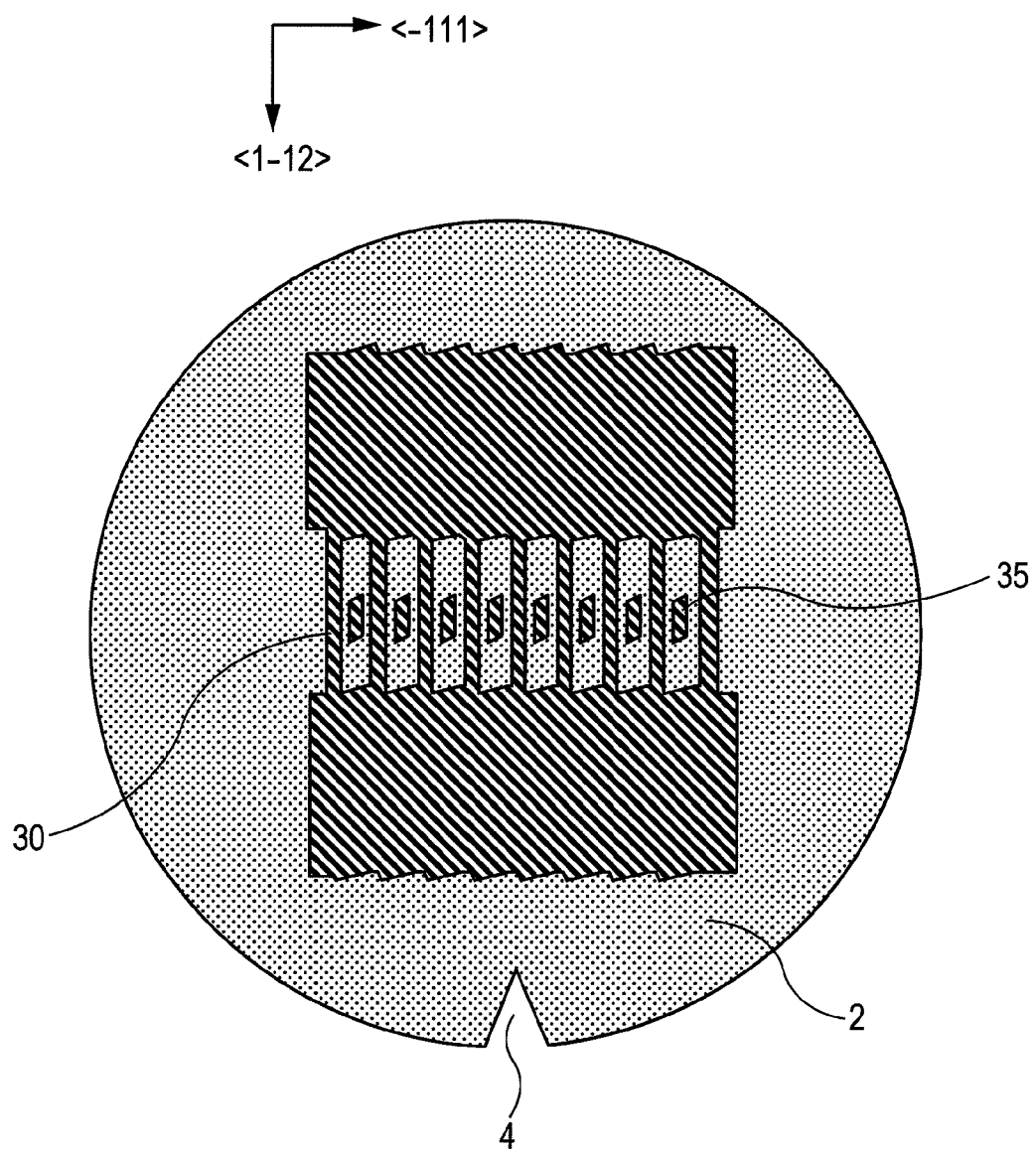
FIG. 26E is a diagram of a sequence of a manufacturing process of the germanium laser diode according to the fourth embodiment as seen from its upper part.

Following this, the SOI substrate was made in a state where the silicon dioxide film 5 used as the hard mask was removed by the wet etching in a solution containing hydrofluoric acid, shown in FIG. 24E, FIG. 25E, and FIG. 26E. Thereby, the line edge roughness that arose by the dry etching to the silicon dioxide film 5 was able to be eliminated completely.

Figure 24F:
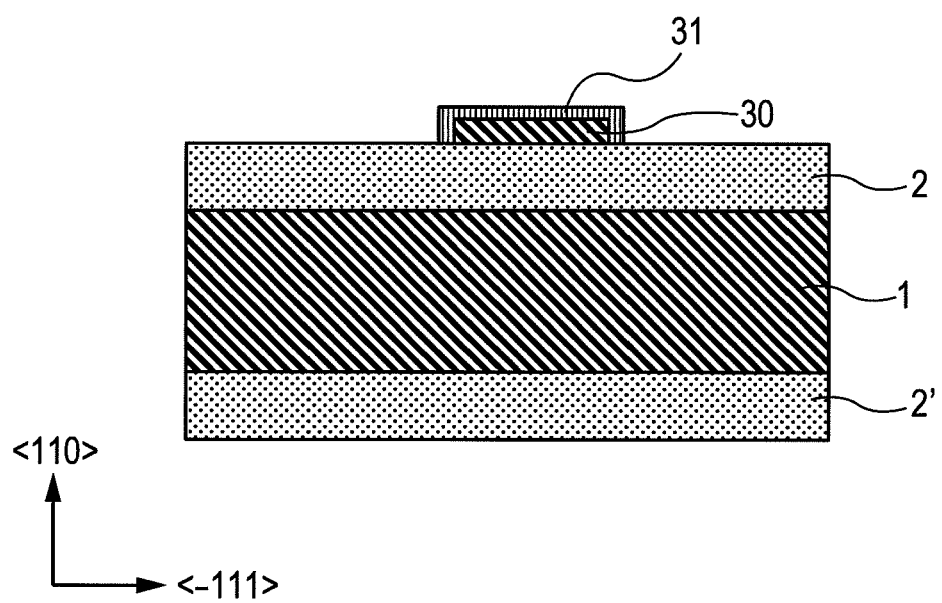
FIG. 24F is a sectional view showing a sequence of a manufacturing process of the germanium laser diode according to the fourth embodiment.
Figure 25F:
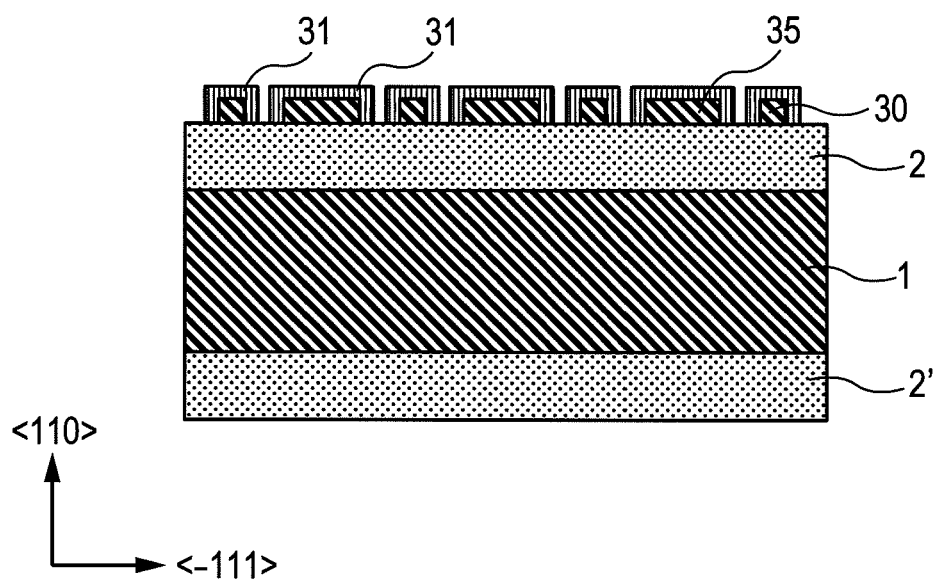
FIG. 25F is a sectional view showing a sequence of manufacturing process of the germanium laser diode according to the fourth embodiment.
Figure 26F:
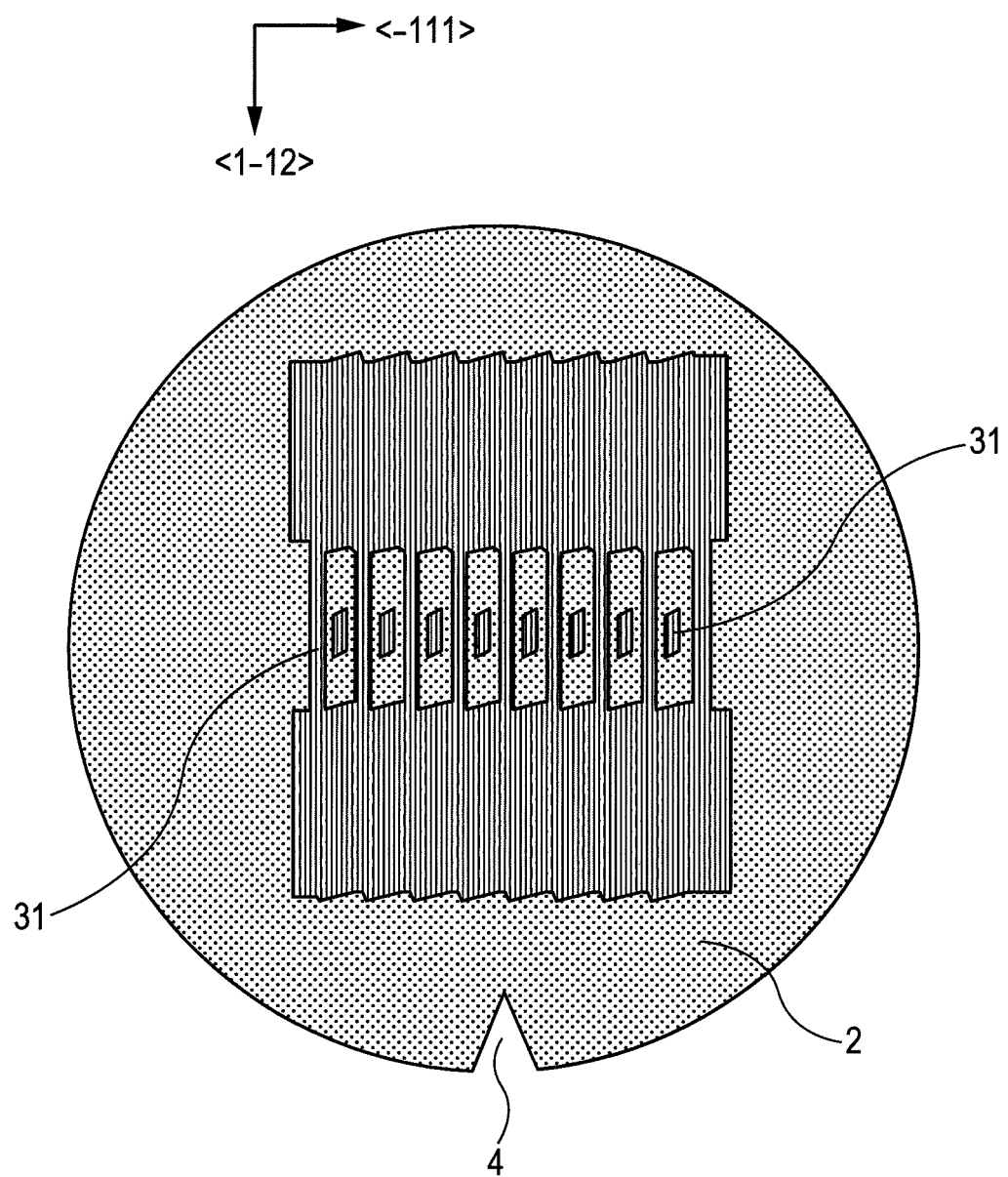
FIG. 26F is a diagram of a sequence of a manufacturing process of the germanium laser diode according to the fourth embodiment as seen from its upper part.

Following this, after undergoing a cleaning process, the SOI substrate was made in a state where silicon-germanium 31 including 80% of silicon and 20% of germanium was preferentially grown to a film thickness of 15 nm on the silicon surface on which the fin-shaped silicon 30 and the silicon optical waveguide core 35 were exposed, shown in FIG. 24F, FIG. 25F, and FIG. 26F. Here, a mixing ratio of silicon and germanium and the film thickness are set to conditions such that no defects enter the film in growing the film epitaxially. As is well known, what is necessary for no defects to be generated in growing silicon-germanium on silicon epitaxially is just to form a film thinner than a critical film thickness set by the germanium concentration. When decreasing the germanium concentration, the critical film thickness can be thickened. Under conditions used in this embodiment, since the silicon-germanium 31 has a thickness less than or equal to the critical film thickness, neither crystal defect nor dislocation is generated.

Figure 24G:
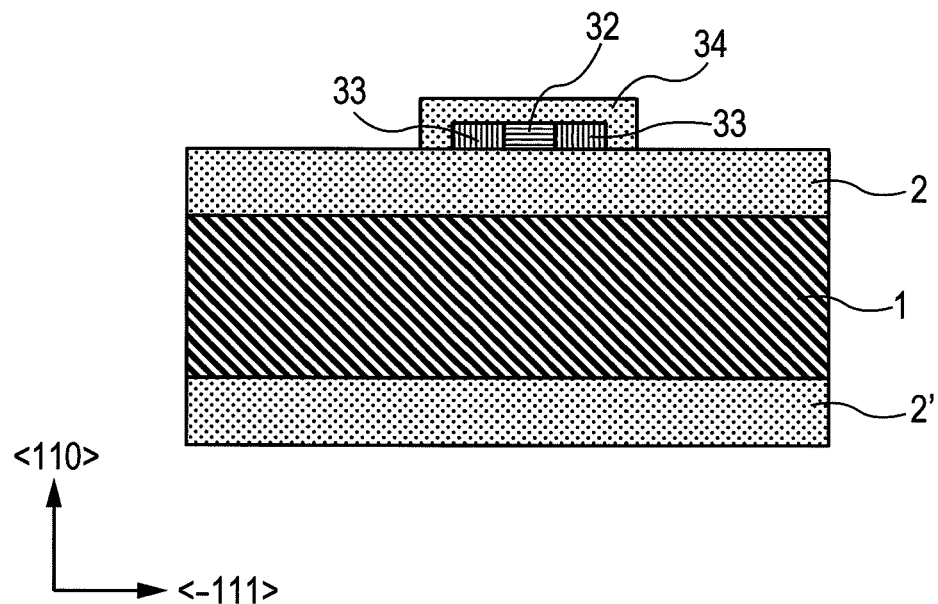
FIG. 24G is a sectional view showing a sequence of a manufacturing process of the germanium laser diode according to the fourth embodiment.
Figure 24H:
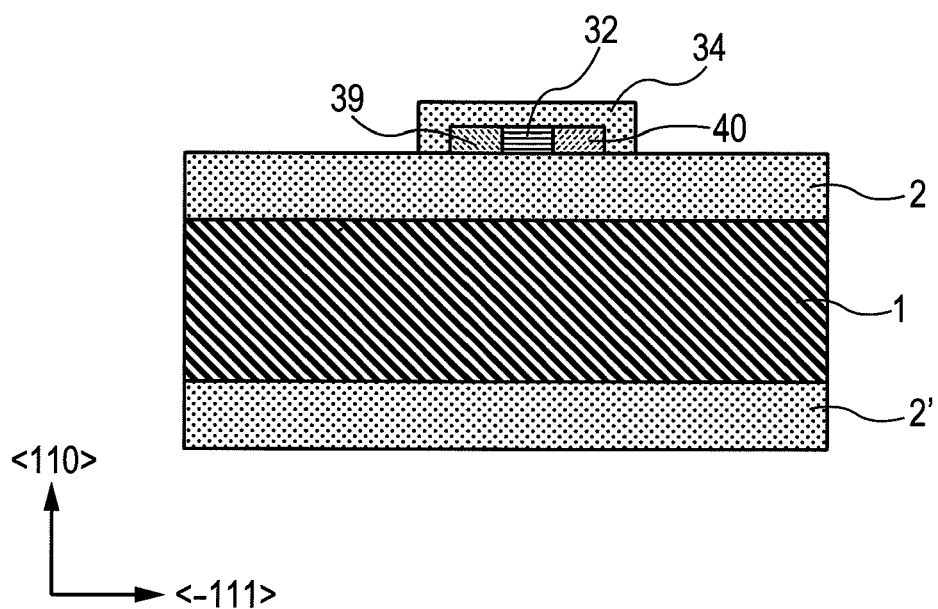
FIG. 24H is a sectional view showing a sequence of a manufacturing process of the germanium laser diode according to the fourth embodiment.
Figure 24I:
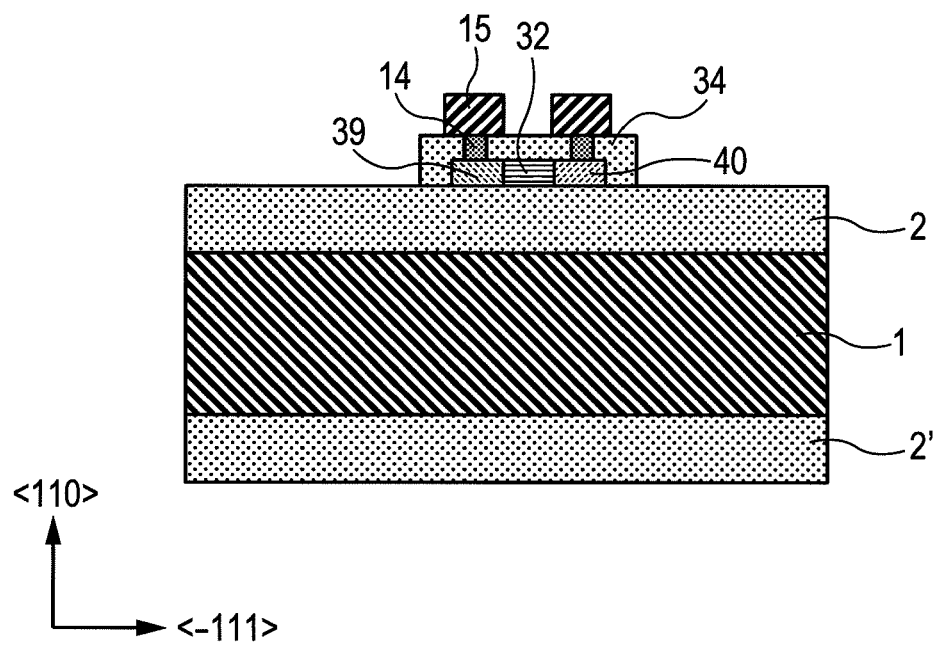
FIG. 24I is a completion sectional view of the germanium laser diode according to the fourth embodiment.
Figure 25G:
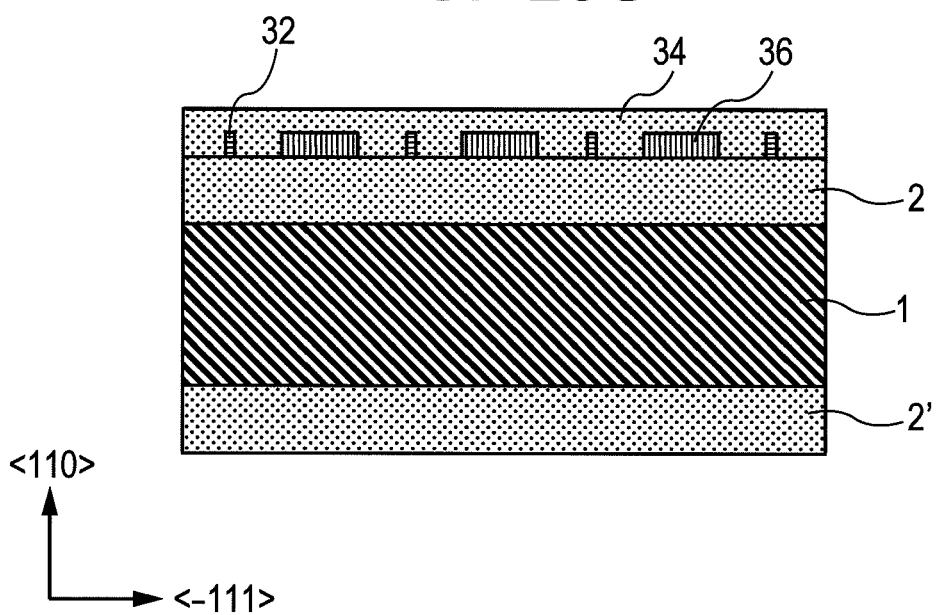
FIG. 25G is a sectional view showing a sequence of manufacturing process of the germanium laser diode according to the fourth embodiment.
Figure 25H:
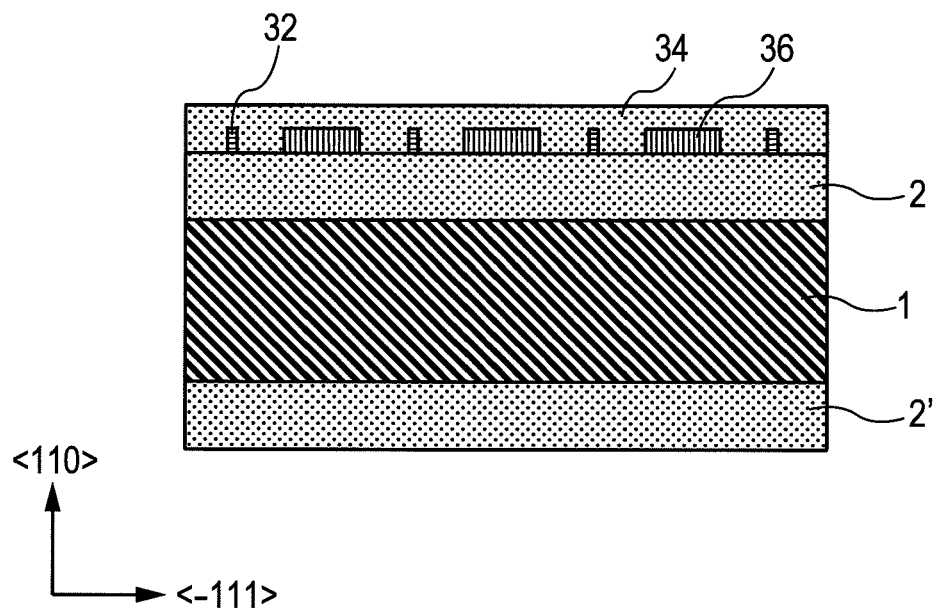
FIG. 25H is a sectional view showing a sequence of a manufacturing process of the germanium laser diode according to the fourth embodiment.
Figure 25I:
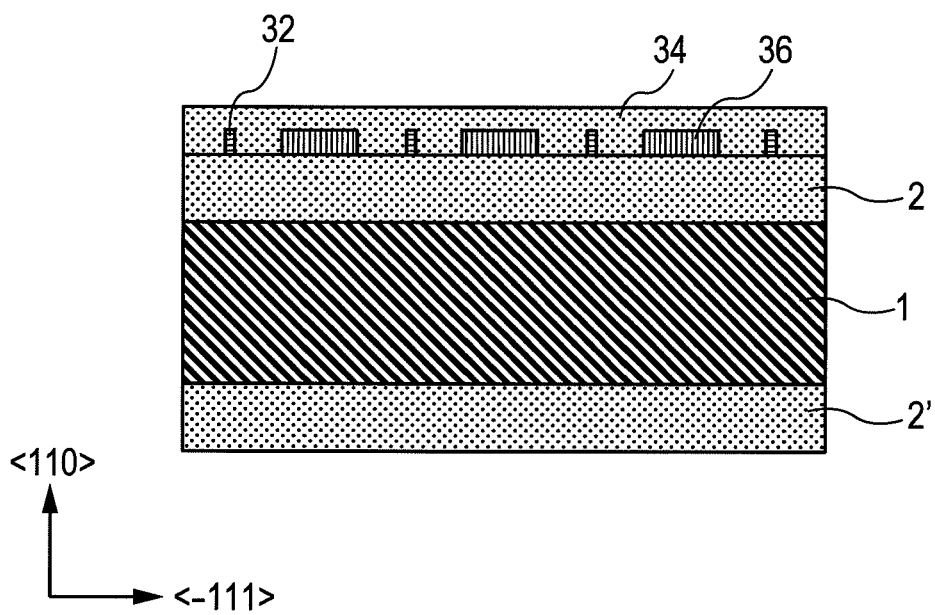
FIG. 25I is a completion sectional view of the germanium laser diode according to the fourth embodiment.
Figure 26G:
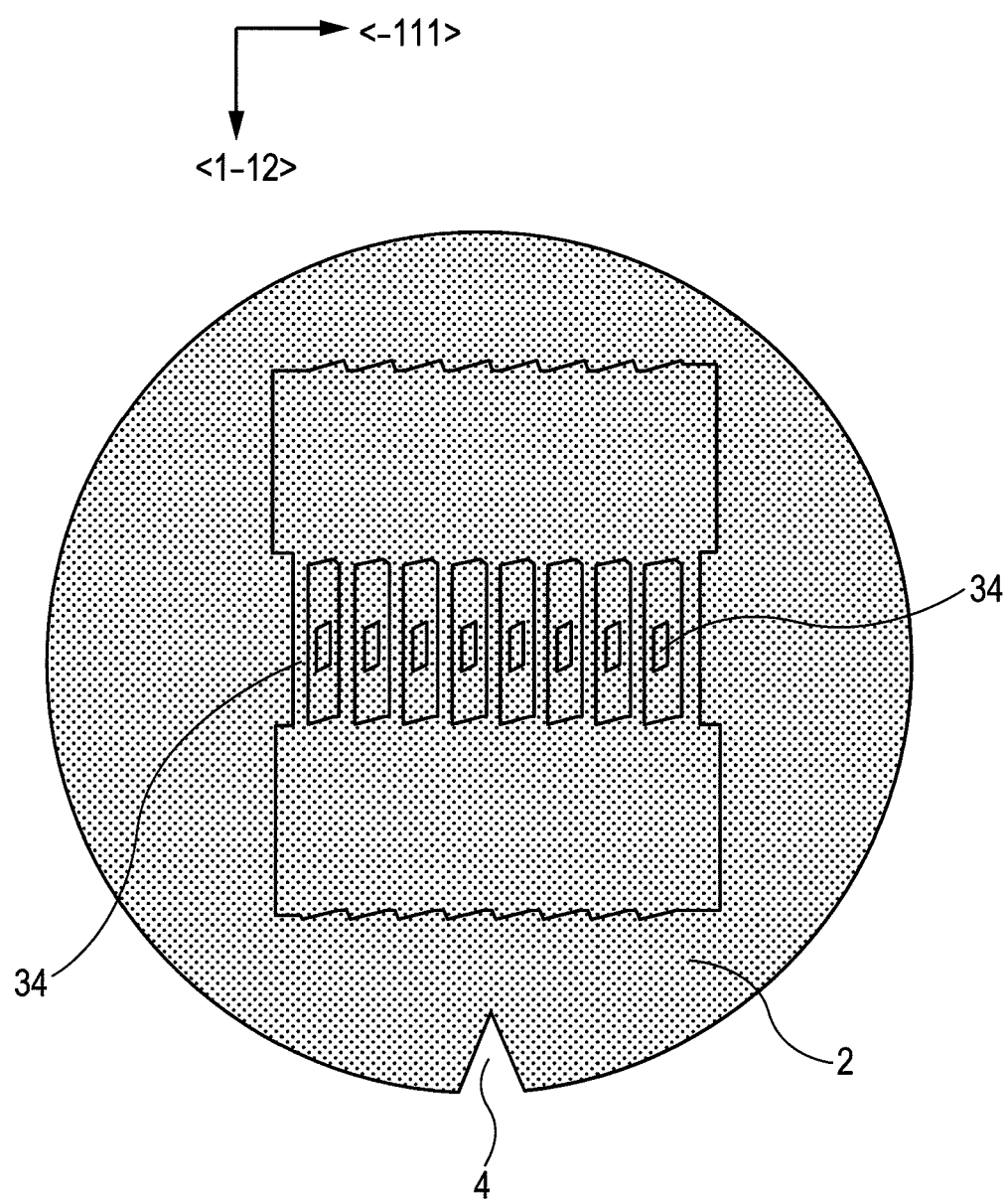
FIG. 26G is a diagram of a sequence of a manufacturing process of the germanium laser diode according to the fourth embodiment as seen from its upper part.
Figure 26H:
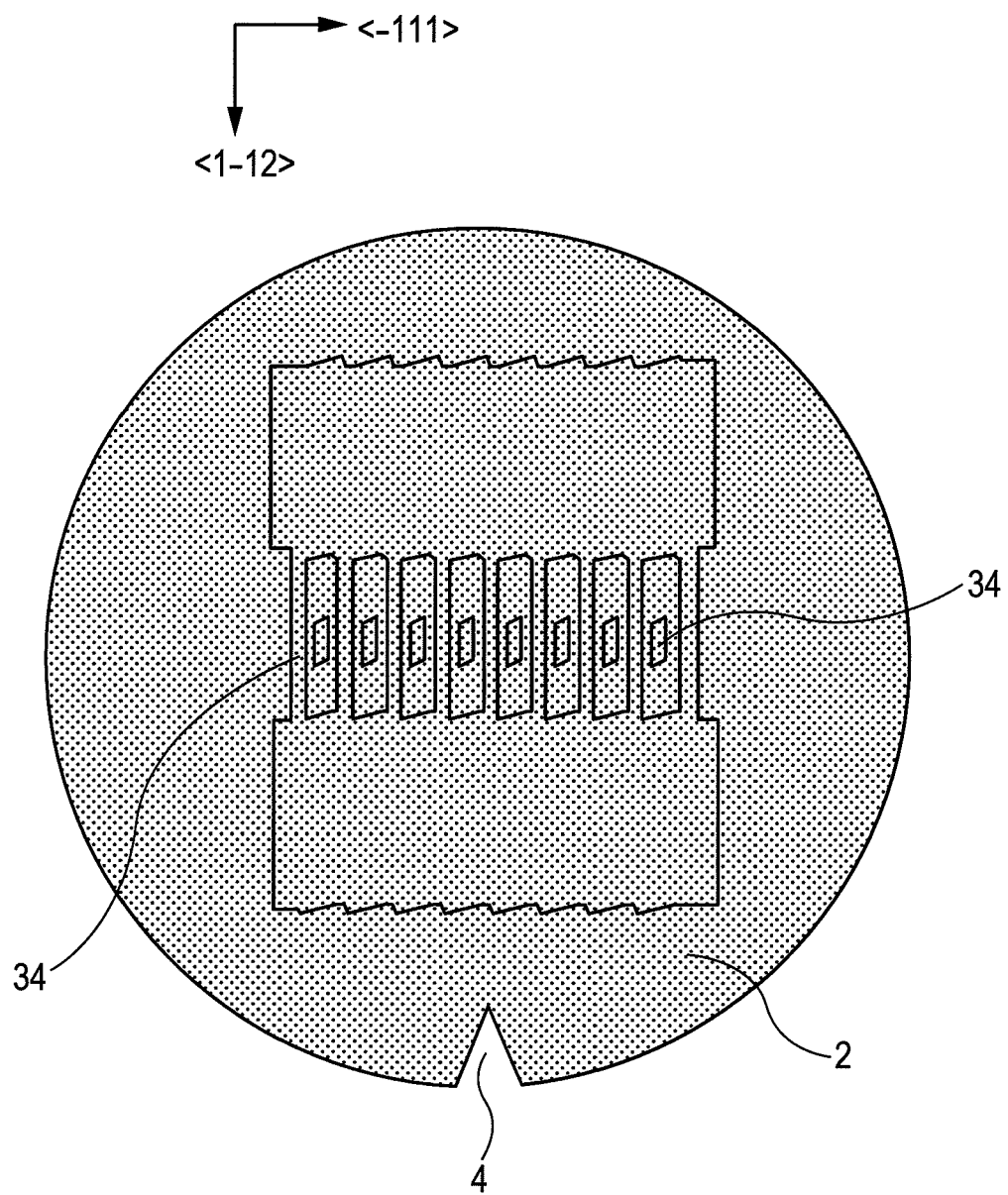
FIG. 26H is a diagram of a sequence of a manufacturing process of the germanium laser diode according to the fourth embodiment as seen from its upper part.

Next, the SOI substrate is made in a state shown in FIG. 24G, FIG. 25G, and FIG. 26G where silicon existing in the silicon-germanium 31 is selectively oxidized by performing an oxidation treatment, an oxidation treatment is performed so that silicon dioxide 34 may be formed to a thickness of 25 nm, a condensed fin-shaped germanium 32 is formed to a thickness of about 3 nm, and a silicon-germanium optical waveguide core 36 that urges the optical waveguide and silicon-germanium 33 that will become the electrode part later are formed. When performing this oxidation treatment, since the silicon dioxide 34 formed on the sidewall parts of the fin-shaped germanium 32 and the silicon dioxide 34 formed on the sidewall parts of the silicon-germanium optical waveguide core 36 collide with each other, the fin-shaped germanium 32 is compressed from the sidewall parts, and a strong stress that elongates the substrate is applied thereto in a perpendicular direction. This stress also urges the fin-shaped germanium 32 to function as a direct transition type semiconductor.

Following this, impurities are put into a desired region of the silicon-germanium 33 through the ion implantation. In doing this, attention is paid so that almost no impurities may be implanted into the fin-shaped germanium 32. This is because if high-concentration impurities remain in the fin-shaped germanium 32, they will form a nonradiative recombination level, which will prevent it from emitting light efficiently. When doping the impurities, first, the resist was left only in a desired region by the resist patterning using photolithography, and subsequently, a p-type silicon-germanium diffusion layer electrode 39 was formed by ion implanting BF2 (boron difluoride) ions to a dose of $1\times10^{15}$ [atoms/cm$^2$]. Then, the resist is removed, subsequently a resist was left only in a desired region by the resist patterning using photolithography again, and then an n-type silicon-germanium diffusion layer electrode 40 was formed by ion implanting P (phosphor) ions to a dose of $1\times10^{15}$ [atoms/cm$^2$]. In these ion implantation processes, since a portion of silicon into which the ions are implanted becomes amorphous, its crystallinity deteriorates. Then, although not shown in the figure, it is important for the conditions to be set so that only a surface of the silicon may become amorphous and the silicon-germanium 33 may remain in the crystalline state in the region where the SOI layer (the single crystal silicon film 3) adjoins the BOX layer (the silicon dioxide film 2). If the acceleration voltage of the ion implantation is set too high, the whole SOI layer (the single crystal silicon film 3) of the region into which the ions are implanted will be made amorphous, and therefore there will arise a problem that even if it is processed by subsequent annealing, the single crystallinity will not be recovered, and will become polycrystalline. If the ion implantation is performed under ion implantation conditions that are set in this embodiment, the crystallinity can be recovered by the activation thermal treatment after the ion implantation because the SOI layer (the single crystal silicon film 3) in a crystalline state remains in the region that adjoins the BOX layer (the silicon oxide film 2). It is very important that the single crystallinity is very excellent In order to acquire an excellent modulation characteristic. Following this, by performing the annealing treatment in a nitrogen atmosphere at 900° C. for 20 minutes, the impurities were activated and, at the same time, the crystallinity of the SOI layer (the single crystal silicon film 3) was recovered. Thereafter, after undergoing a cleaning process, the SOI substrate is made in a state shown in FIG. 24H, FIG. 25H, and FIG. 26H.

Following this, an opening (not illustrated) was processed in a desired region of a party of the silicon dioxide 34 by the resist patterning using photolithography and the wet etching. Following this, a TiN film and an Al film were deposited on the whole surface after a cleaning process, resist was left only in a desired region again by resist patterning using photolithography, subsequently, the Al film was wet etched using an etching solution containing phosphoric acid, acetic acid, and nitric acid, and then, the TiN film was wet etched using an etching solution containing ammonia and hydrogen peroxide. As a result, the TiN electrode 14 and the Al electrode 15 were patterned. Following this, the SOI substrate was given a hydrogen annealing treatment at a temperature of 400° C., and the device was completed as a state shown in FIG. 24I, FIG. 25I, and FIG. 26I by performing a hydrogen termination treatment on defects that arose during the process.

Figure 26I:
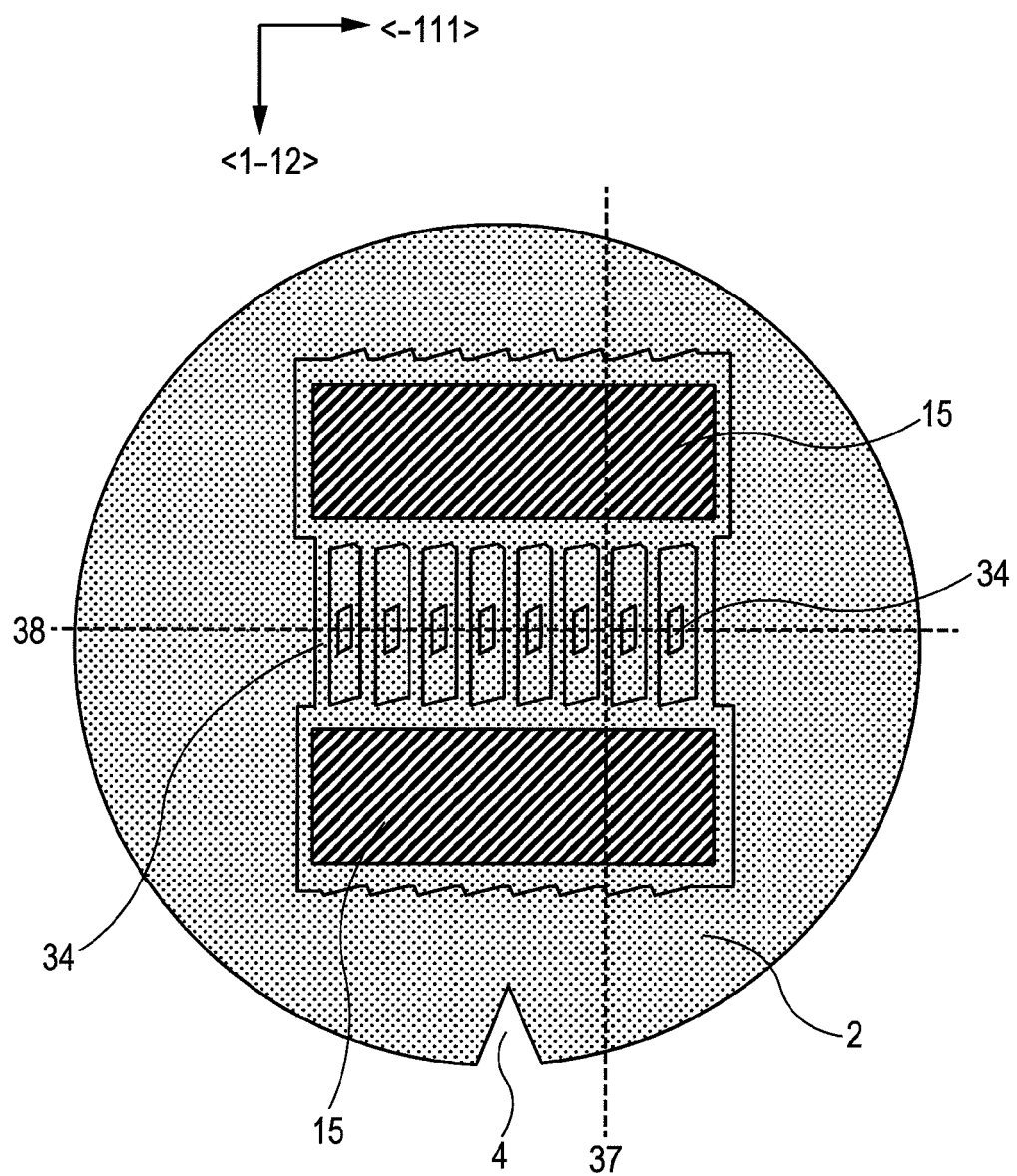
FIG. 26I is a diagram of the germanium laser diode according to the fourth embodiment as seen from its upper part.

Here, a structure of the germanium laser diode of this embodiment that is formed by the above-mentioned production method will be explained using FIG. 24I, FIG. 25I, and FIG. 26I.

The germanium laser diode of this embodiment has a configuration in which the silicon dioxide film 2 that is an insulator film is formed on the silicon substrate 1 being the supporting substrate, and the germanium laser diode has the n-type silicon-germanium diffusion layer electrode 40 for injecting electrons, the p-type silicon-germanium diffusion layer electrode 39 for injecting positive holes, and the fin-shaped germanium 32 acting as a light emitting part that is placed between these n-type silicon-germanium diffusion layer electrode 40 and p-type silicon-germanium diffusion layer electrode 39 and is electrically connected with these n-type silicon-germanium diffusion layer electrode 40 and p-type silicon-germanium diffusion layer electrode 39 on this silicon dioxide film 2, and in which electrons and positive holes are injected into the fin-shaped germanium 32 by injecting a current between the n-type silicon-germanium diffusion layer electrode 40 and the p-type silicon-germanium diffusion layer electrode 39. A gate electrode G may be formed in a basal portion of this n-type silicon-germanium diffusion layer electrode 40 and in a basal portion of this p-type silicon-germanium diffusion layer electrode 39. This is because a band of the single crystal germanium can be bent by making a current flow into the gate electrode and electrons and positive holes can be efficiently injected efficiently.

Figure 26J:
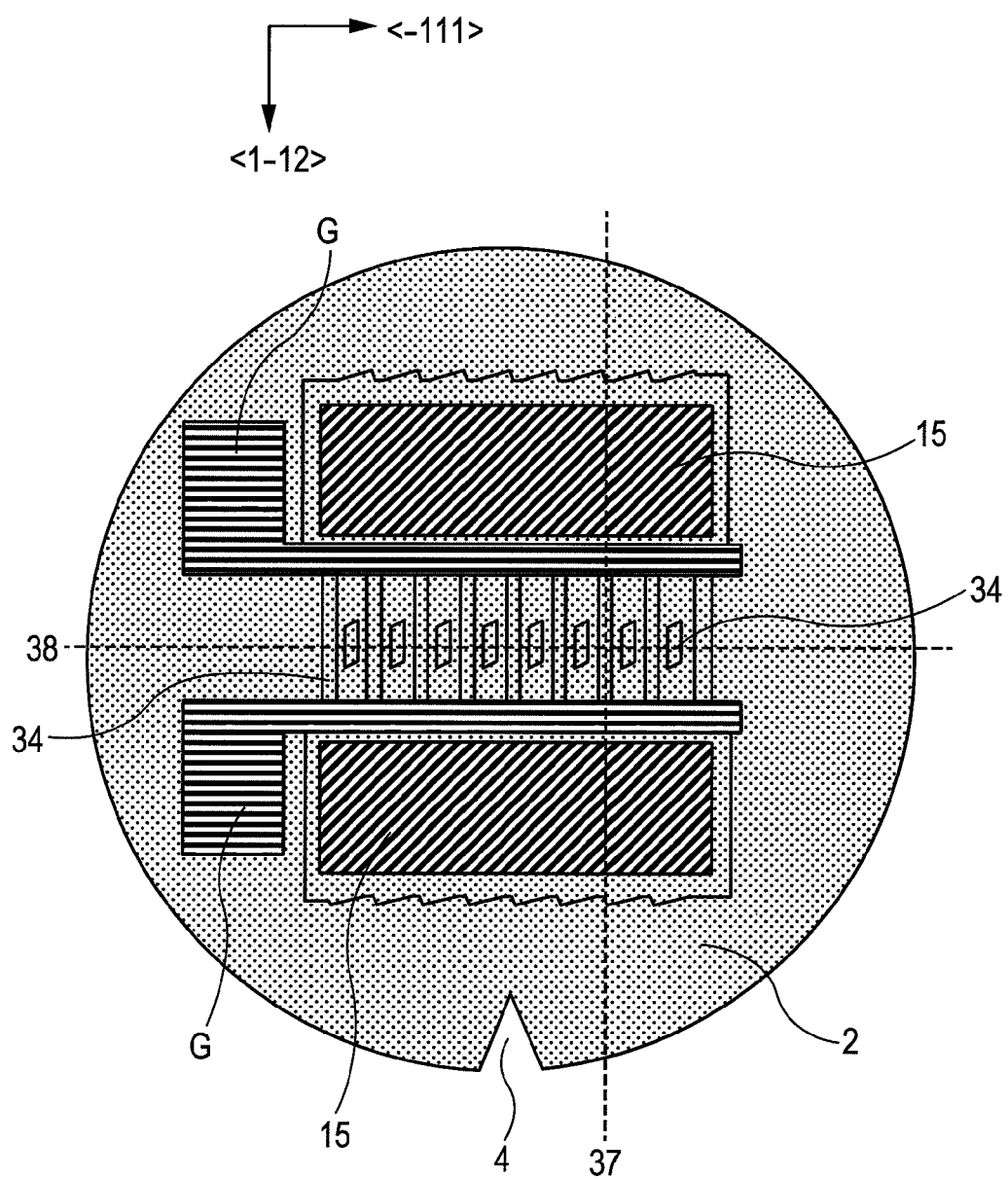
FIG. 26J is a diagram of the germanium laser diode according to the fourth embodiment as seen from its upper part.

The fin-shaped germanium 32 that will serve as the light emitting part is ultra thin single-crystal germanium, and a plane orientation of the sidewalls of the fin-shaped germanium 32 is the (111) plane. In this state, "L-point of the band of the fin-shaped germanium 32 is projected to Γ-point and germanium functions as the direct transition type semiconductor. Moreover, since a compressive stress is added to the fin-shaped germanium 32 from the sidewalls thereof and it elongates in a direction perpendicular to the silicon substrate 1, its band structure is deformed and a luminous efficiency as the direct transition type semiconductor improves more. Furthermore, if the gate electrode G is provided in a basal portion of the fin-shaped germanium 32 as shown in FIG. 26J, a band gap of the single crystal germanium will be able to be bent by applying a voltage thereto, and it will become possible to inject carriers more efficiently.

The formed germanium laser diode oscillated at about 1500 nm that was a design wavelength, and was a single mode according to its spectral analysis. Thus, the germanium laser diode according to the present invention has a distributed feed-back structure, which selectively enhances a wavelength decided by a periodical structure of a mirror, and therefore it can perform single-mode oscillation. In order to assure single modality, it was also possible to achieve the single modality easily by optimizing an optical waveguide structure of the silicon-germanium optical waveguide core 36 (not illustrated) so that a phase of light shifts by a quarter wavelength in the vicinity of its center.

Although the light emitting device that uses the single crystal germanium as a luminous layer was disclosed in this embodiment, it is all right to use other semiconductor materials. For example, by using a semiconductor material of a GaN system to utilize a nonpolar surface, it is possible to control the emission wavelength.

In the foregoing, although the present invention made by the inventors was concretely explained based on the embodiments, it is needless to say that the present invention is not limited to the embodiments and can be modified variously in a range without departing its gist.

LIST OF REFERENCE SIGNS

1 Silicon substrate
2 Silicon dioxide film
3 Single crystal silicon film
4 Notch
5 Silicon dioxide film
6 Silicon optical waveguide core
7 Silicon optical waveguide cladding
8 Modulation part silicon optical waveguide core
9 Silicon dioxide hard mask
10 Opening
11 Thin film single crystal silicon
12 p-type diffusion layer electrode
13 n-type diffusion layer electrode
14 TiN electrode
15 Al electrode
16 Tapered optical coupling part
17 Cutting line
18 Inverse tapered optical coupling part
19 Organic optical waveguide
20 Thin film p-type diffusion layer
21 Thin film n-type diffusion layer
22 Forked branch part
23 Steep bend section
24 Curvilinear bend section
25 Silicon dioxide hard mask
30 Fin shaped silicon
31 Silicon-germanium
32 Fin-shaped germanium
33 Silicon-germanium
34 Silicon dioxide
35 Silicon optical waveguide core
36 Silicon-germanium optical wave
37 Cutting line
38 Cutting line
39 p-type silicon-germanium diffusion layer electrode
40 n-type silicon-germanium diffusion layer electrode
G Gate electrode

The invention claimed is:

1. An optical element, comprising:
a silicon substrate; and
a first optical waveguide that is placed on the silicon substrate and has a core of single crystal silicon such that a plane orientation of its upper surface is a (110) plane or a plane orientation crystallographically equivalent to the (110) plane and a plane orientation of its side faces is a (111) plane or a plane orientation crystallographically equivalent to the (111) plane.

2. An optical element, comprising:
a silicon substrate; and
a first optical waveguide that is placed on the silicon substrate, a plane orientation of whose upper surface is a (110) plane or a plane orientation crystallographically equivalent to the (110) plane, and that has a core of single crystal silicon extending in either one direction of a <1-12> direction and a <-112> direction and having a rectangular cross section.

3. The optical element according to claim 1,
wherein the core is formed of silicon.

4. The optical element according to claim 2,
wherein the core is formed of silicon.

5. The optical element according to claim 1,
wherein the optical waveguide has a cladding layer that is formed of a silicon oxide film on the core.

6. The optical element according to claim 2,
wherein the optical waveguide has a cladding layer that is formed of a silicon oxide film on the core.

7. The optical element according to claim 1,
wherein the optical element has a silicon oxide film placed under the silicon substrate.

8. The optical element according to claim 2,
wherein the optical element has a silicon oxide film placed under the silicon substrate.

9. The optical element according to claim 1,
wherein the core of the first optical waveguide extends in one direction of a <1-12> direction and a <-112> direction, and
wherein the optical element comprises a second optical waveguide having a core that is connected to the core of the first optical waveguide and extends in the other direction of the <1-12> direction and the <-112> direction.

10. The optical element according to claim 2, comprising:
a second optical waveguide having a core that is connected to the core of the first optical waveguide and extends in the other direction of the <1-12> direction and the <-112> direction.

11. The optical element according to claim 1, comprising:
a second optical waveguide having a core connected to the core of the first optical waveguide at an angle of arc $\cos(1/3) \times 180/\pi$.

12. The optical element according to claim 2, comprising:
a second optical waveguide having a core connected to the core of the first optical waveguide at an angle of arc $\cos(1/3) \times 180/\pi$.

* * * * *